United States Patent
Towner et al.

(10) Patent No.: US 9,439,329 B1
(45) Date of Patent: Sep. 6, 2016

(54) INFLATABLE DATA CENTER

(71) Applicant: Amazon Technologies, Inc., Seattle, WA (US)

(72) Inventors: Stephanie Towner, Ashland, VA (US); Brock Robert Gardner, Seattle, WA (US); Giorgio Arturo Pompei, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/668,780

(22) Filed: Mar. 25, 2015

(51) Int. Cl.
H05K 7/20 (2006.01)
H05K 7/14 (2006.01)
E04H 15/20 (2006.01)

(52) U.S. Cl.
CPC ........ H05K 7/20745 (2013.01); H05K 7/1497 (2013.01)

(58) Field of Classification Search
CPC ............ H05K 7/20; H05K 5/00; H05K 5/04; H05K 13/00; H05K 7/02; G06F 1/20; E04H 1/00; E04H 15/20; E04H 15/22; E04B 1/80
USPC ............ 361/679.01, 679.02, 679.46–679.49, 361/690–695; 454/184; 165/80.2, 122–126; 312/223.2
See application file for complete search history.

(56) References Cited

U.S. PATENT DOCUMENTS

| | | | | |
|---|---|---|---|---|
| 2,990,837 A * | 7/1961 | Cushman | ................ | E04H 15/20 4/506 |
| 3,227,169 A * | 1/1966 | Fischer | .................. | E04H 15/20 52/2.19 |
| 3,898,775 A * | 8/1975 | Webb | ...................... | E04H 15/22 52/2.14 |
| 4,027,437 A * | 6/1977 | Monsky | ............... | A01G 9/1415 126/633 |
| 4,060,054 A * | 11/1977 | Blair | ..................... | A01K 1/0227 119/444 |
| 4,164,829 A * | 8/1979 | Sadler | .................... | E04H 1/125 135/117 |
| 6,070,366 A * | 6/2000 | Pierson | ................... | E04H 15/22 52/2.17 |
| 7,770,332 B2* | 8/2010 | Semiz | .................... | B64G 1/002 52/2.11 |
| 2014/0007451 A1* | 1/2014 | Brown, Jr. | .............. | A01F 25/00 34/265 |
| 2015/0342096 A1* | 11/2015 | Czamara | ............. | H05K 7/1497 361/679.49 |

OTHER PUBLICATIONS

Rich Miller, "Modular Data Centers—The Space Station Data Center," Jan. 14, 2013, This content was printed from Data Center Knowledge, pp. 1-3.

* cited by examiner

*Primary Examiner* — Michail V Datskovskiy
(74) *Attorney, Agent, or Firm* — Robert C. Kowert; Meyertons, Hood, Kivlin, Kowert & Goetzel, P.C.

(57) ABSTRACT

A data center can include an inflatable enclosure in which rack computer systems can be installed and can provide computing capacity. The inflatable enclosure includes an inflatable structure which is at least partially inflated based on cooling air discharged into the inflatable enclosure by one or more cooling modules. A cooling module can include a cooling system and a cooling air vent, where the cooling system adjustably induces a stream of cooling air and the cooling air vent adjustably directs the cooling air stream into a particular space enclosed by an inflatable structure. The inflatable enclosure can be established by separate modules positioned on opposite sides of a space and an inflatable structure which extends across the space between the modules. The inflatable structure can be extended over additional spaces to expand the inflatable enclosure, thereby providing additional space to install rack computer systems.

20 Claims, 11 Drawing Sheets

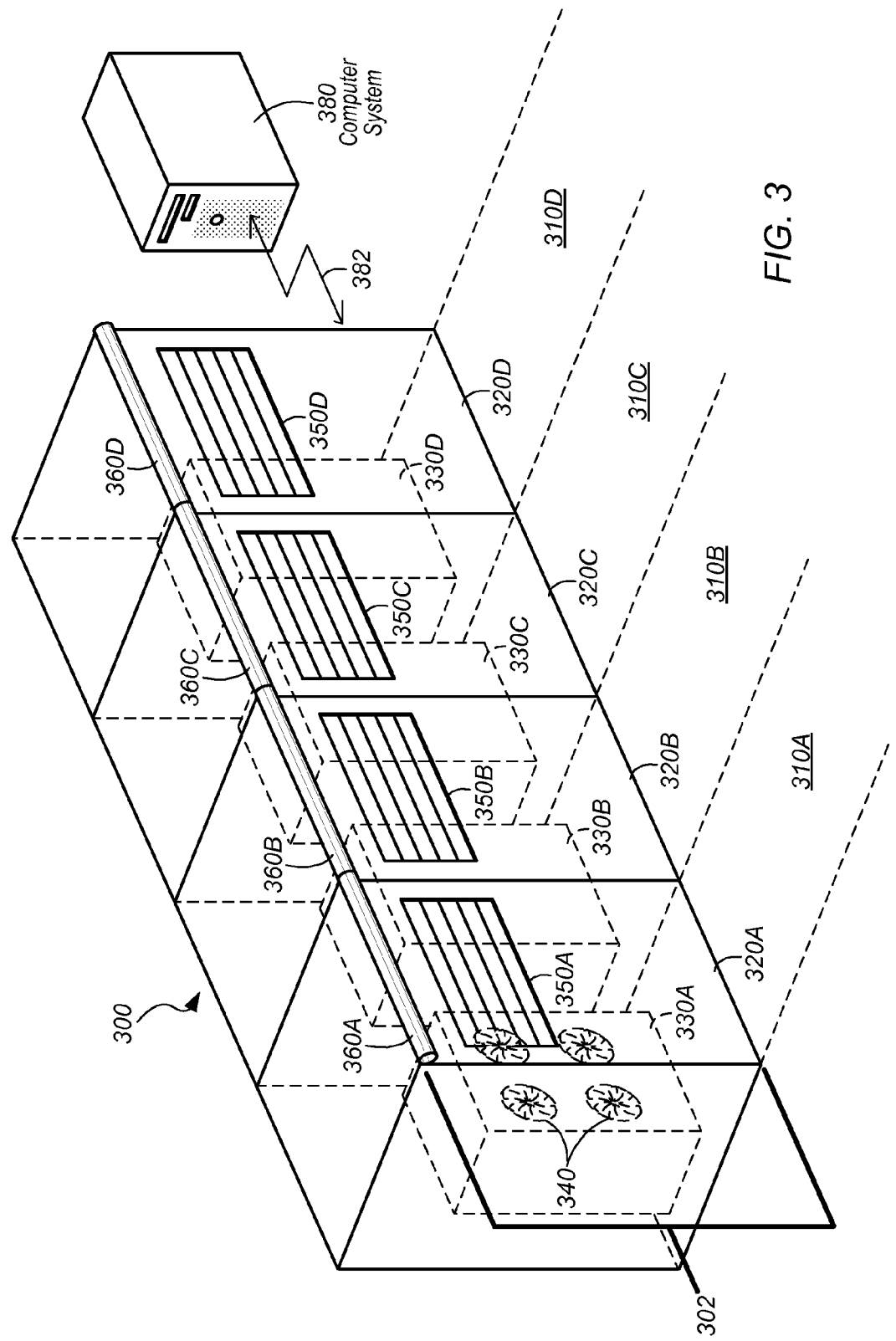

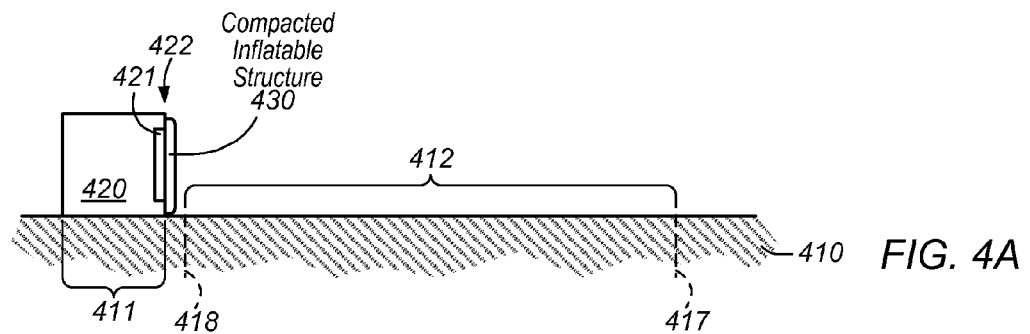
FIG. 4A
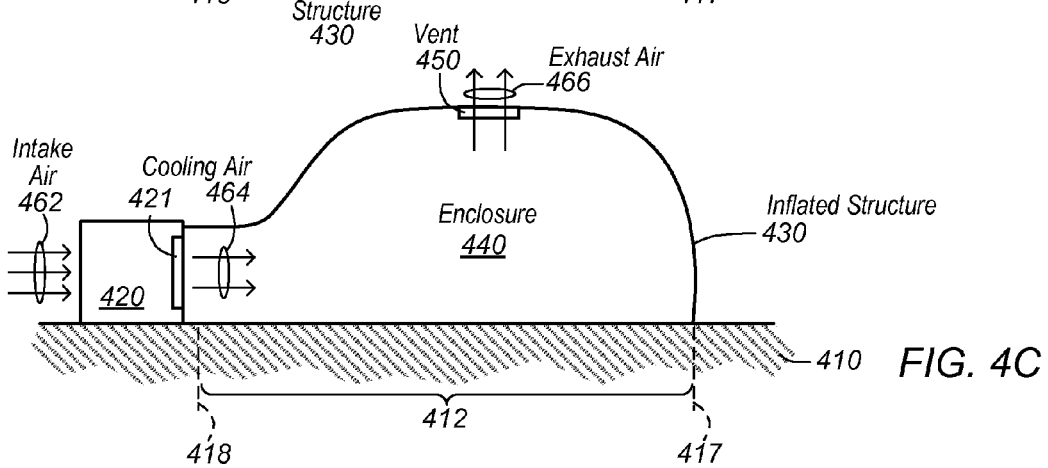
FIG. 4B
FIG. 4C
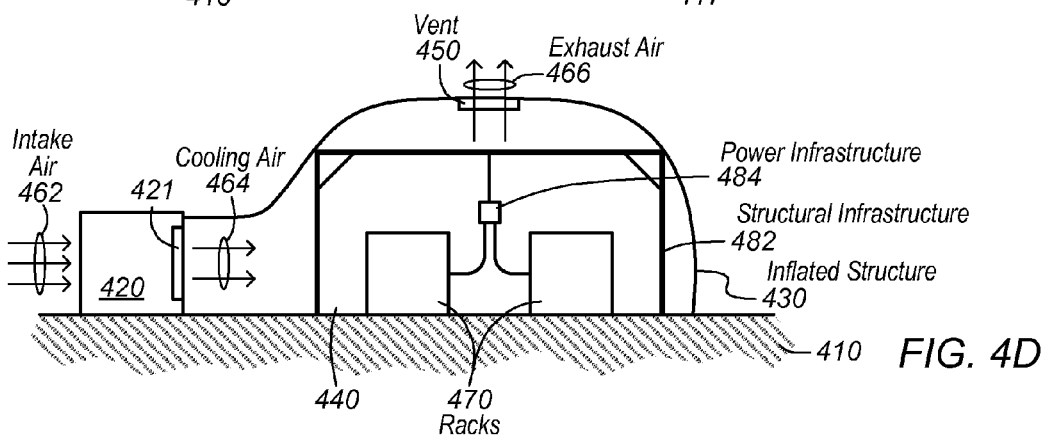
FIG. 4D

INFLATABLE DATA CENTER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect. Substantial time and resources are typically required to design and build a data center (or expansion thereof), lay cables, install racks and cooling systems. Additional time and resources are typically needed to conduct inspections and obtain certifications and approvals, such as for electrical and HVAC systems.

BRIEF DESCRIPTION OF THE DRAWINGS

FIG. 3 illustrates a perspective view of a data center which includes an inflatable structure spanning an inflatable enclosure between a cooling module located at one end of the inflatable enclosure and an electrical module located at an opposite end of the inflatable enclosure, according to some embodiments.

FIG. 4A-D illustrate orthogonal views of a data center which includes an inflatable enclosure which is inflated by cooling air discharged from a cooling module and in which rack computer systems and infrastructure are installed, according to some embodiments.

Figure 1:
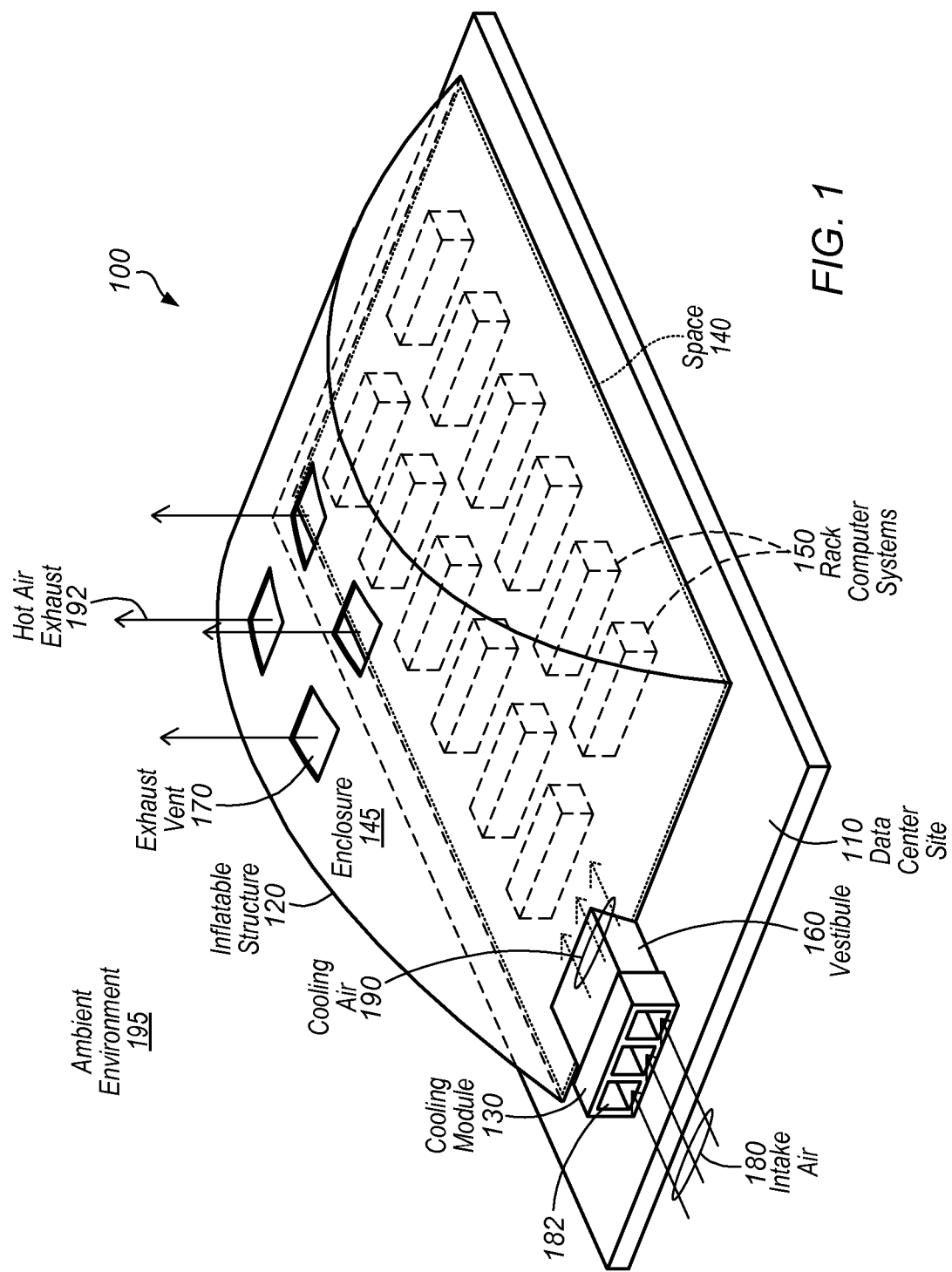
FIG. 1 illustrates a perspective view of a data center which includes a cooling module and an inflatable enclosure, in which rack computer systems are installed, inflated by cooling air discharged from the cooling module, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an inflatable data center are disclosed. According to one embodiment, a method for deployment of a data center includes positioning a pre-fabricated electrical module at a particular data center site, positioning a pre-fabricated cooling module at the particular data center site, inflating an inflatable structure at the data center site such that the inflated structure establishes an inflatable enclosure of the particular data center site, based on operating the cooling module such that the inflatable enclosure structure is at least partially inflated by the cooling module, installing a rack computer system within the inflatable enclosure, and operating at least one of the rack computer systems in the inflatable enclosure to provide computing capacity. The electrical module provides one or more of electrical power support and network communication support to the rack computer system. The cooling module provides cooling support to the rack computer system via a stream of cooling air directed out of at least one cooling air vent of the cooling module. Installing the rack computer system within the inflatable enclosure includes electrically coupling the rack computer systems to the at least one electrical module.

According to one embodiment, a method includes operating a cooling module, so that the cooling module discharges a stream of cooling air into a particular space, and inflating an inflatable structure, such that the inflated inflatable structure at least partially establishes an enclosure of the particular space, based at least in part upon the stream of cooling air discharged into the particular space by the at least one cooling module. The cooling module provides cooling support to a rack computer system based at least in part upon the discharged stream of cooling air.

According to one embodiment, a system includes a rack computer system, a cooling module, and an inflatable structure. The rack computer system is installed in a particular space and provides computing capacity. The cooling module includes a cooling air vent and provides cooling support to the rack computer system via a stream of cooling air discharged via the cooling air vent into the particular space. The inflatable structure at least partially establishes an inflatable enclosure of the particular space based at least in part upon the stream of cooling air discharged by the cooling air vent of the cooling module into the particular space.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center module" means a module that includes, or is suitable for housing and/or physically supporting, one or more computer systems that can provide computing resources for a data center.

As used herein, "electrical module" means a module that distributes electrical power to systems or components external to the electrical module.

As used herein, "network communication module" means a module which communicatively couples one or more systems or components external to the network communication module with one or more communication networks.

As used herein, "external cooling system" means a cooling system external to a modular computing system. For example, an external cooling system may be a chilled water system that is coupled to a modular computing system. An external cooling system may be located inside a facility or outdoors.

As used herein, a "free cooling" includes operation in which an air handling system pulls air at least partially from an external source (such as air outside a facility) and/or a return from a computer room, and forces the air to electronic equipment without active chilling in the air-handling subsystem.

As used herein, "active cooling", "active chilling", etc. refers to cooling of air by a process which involves transferring heat from the air to one or more other fluids which are separate from the air. Such other fluids can include water, various coolants, refrigerants, some combination thereof, etc. Active cooling systems can include heat exchangers which remove heat from the one or more other fluids. An example of an active cooling system can include a cooling system which includes circulating air through a data center module to remove heat from heat producing components therein, and circulating a separate fluid through one or more pathways in the data center module, including pipes, coils, heat exchangers, etc. to cool the circulating air before the air removes heat from such components, after the air removes heat from such components, concurrently with the air removing heat from such components, some combination thereof, etc. Another example of an active cooling system includes chilled water cooling systems. An example of active cooling includes cooling air by a process which includes mechanical cooling. An example of active cooling includes cooling air by a process which includes evaporative cooling.

As used herein, "mechanical cooling" means cooling of air by a process that involves doing mechanical work on at least one other fluid, such as occurs in vapor-compression refrigeration systems, etc.

As used herein, "evaporative cooling" means cooling of air by evaporation of liquid.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, "movable" means a component or combination or components having a container, housing, frame or other structure that allows the module to be moved as a unit from one location to another. For example, a movable module may be moved as a unit on a flatbed trailer. In some cases, a movable module may be attached to a portion of a floor, building, or permanent structure when deployed. For example, a movable module may be bolted to the floor of a data center facility.

As used herein, a "rack" means rack, container, frame, or other element or combination of elements that can contain or physically support one or more computer systems.

As used herein, a "space" means a space, area or volume.

FIG. 1 illustrates a perspective view of a data center which includes a cooling module and an inflatable structure, in which rack computer systems are installed, inflated by cooling air discharged from the cooling module, according to some embodiments.

Data center 100 includes a data center site 110 which comprises a prepared surface upon which the various components of the data center are located. The data center 100 includes an inflated inflatable structure 120 which encloses a particular space 140 in the data center site 110, thereby establishing an enclosure 145 of space 140. The particular space 140 enclosed by the inflated inflatable structure 120 can be a limited portion of the prepared surface of the data center site 110. The enclosure 145 of the particular space 140 by the inflated structure 120 can be referred to herein interchangeably as an "inflatable enclosure" 145 of the space 140. As referred to herein, an "inflatable structure" refers to a structure which is configured to be structurally supported by air, in an inflated state which establishes an inflatable enclosure, such that the inflatable enclosure established by the inflated inflatable structure at least partially derives its structural integrity from the air within the inflatable enclosure.

Data center 100 includes a set of rack computer systems 150 installed in the particular space 140. The rack computer systems 150 can include one or more data center modules which include one or more structural housings which include one or more sets of rack computer systems. Such structural housings can conform to one or more standardized form factors, including one or more shipping container form factors.

Data center 100 includes a cooling module 130 which provides cooling support to the rack computer systems 150 installed in the particular space 140 enclosed by the inflated structure 120. The cooling module 130 includes one or more cooling systems which provide cooling air 190 into the space 140, where the cooling air 190 removes heat from one or more of the rack computer systems 150, thereby providing cooling support to the one or more rack computer systems 150. As shown, cooling module 130 includes a set of air inlets 182 which can receive intake air 180 from an ambient environment 195 external to the inflatable enclosure 145 of the particular space 140 and can provide cooling air 190, from one or more cooling air vents (not shown in FIG. 1) of the cooling module 130 into the particular space 140.

In some embodiments, the inflatable structure 120 is directly coupled to a particular side of the cooling module 130 which includes the cooling air vents, such that the inflatable structure 120 forms a partition between the particular space 140 and the ambient environment, such that cooling air 190 discharged by the cooling module 130 is precluded from passing directly to the ambient environment. In some embodiments, including the illustrated embodiment shown in FIG. 1, the cooling module 130 is coupled to the inflatable structure 120 via one or more vestibule structures 160 which establish one or more sealed air pathways from the one or more cooling air vents of the cooling module 130 into the particular space 140.

The one or more cooling systems included in the cooling module 130 can include one or more various cooling systems which induce one or more streams of cooling air 190. For example, the cooling module 130 can include an active chilling system, which can include one or more coolant circulation systems, chilled water systems, mechanical cooling systems, direct evaporation systems, some combination thereof, etc. which actively chill intake air 180 entering the cooling module 180 into cooling air 190. In some embodiments, the cooling module includes a free-cooling system. A cooling systems included in the cooling module can include one or more sets of air moving devices which are configured to induce at least one stream of cooling air 190.

Inflatable structure 120 includes a set of exhaust vents 170 which direct exhaust air 192 out of the particular space 140 and into the ambient environment 195. In some embodiments, cooling air 190 directed into the particular space 140 passes through one or more rack computer systems 150 and removes heat from one or more heat-generating components included in the one or more rack computer systems 150, thereby becoming exhaust air 192. The exhaust air, having removed heat from one or more rack computer systems 150, can have an elevated temperature relative to cooling air 190 and can be pushed upwards in space 140 by the denser, lower temperature cooling air 190. As a result, the exhaust air 192 "rises" to the top of the inflatable enclosure 145 of space 140 and can pass out of the inflatable enclosure 145 via one or more exhaust vents 170 which are coupled to a portion of the inflated structure 120 which is located at the top of the inflatable enclosure of space 140, as shown in FIG. 1.

In some embodiments, the data center 100 includes one or more additional modules which provide one or more additional instances of infrastructure support. For example, data center 100 can include a network communication module which includes one or more instances of network communication infrastructure, including network communication pathways, network switching devices, etc., and can provide network communication support to rack computer systems coupled to the network communication module. In another example, data center 100 can include an electrical module which includes one or more instances of power distribution infrastructure which can provide electrical power support to the one or more rack computer systems in the data center. In some embodiments, the electrical module provides electrical power support and network communication support to at least some of the rack computer systems installed in the data center. Modules which provide one or more instances of infrastructure support can be referred to herein as "infrastructure modules", and an infrastructure module can include one or more of a cooling module, electrical module, network communication module, etc.

As referred to herein, a rack computer system which is "installed" in a data center is mounted at a location which structurally supports the rack computer system and is further coupled to one or more instances of infrastructure support, such that the rack computer system can perform computing operations and provide computing capacity. For example, an installed rack computer system 150 in data center 150 is mounted on the portion of the prepared surface of the site 110 and is coupled to both electrical power support infrastructure and network communication support infrastructure.

Figure 2A:
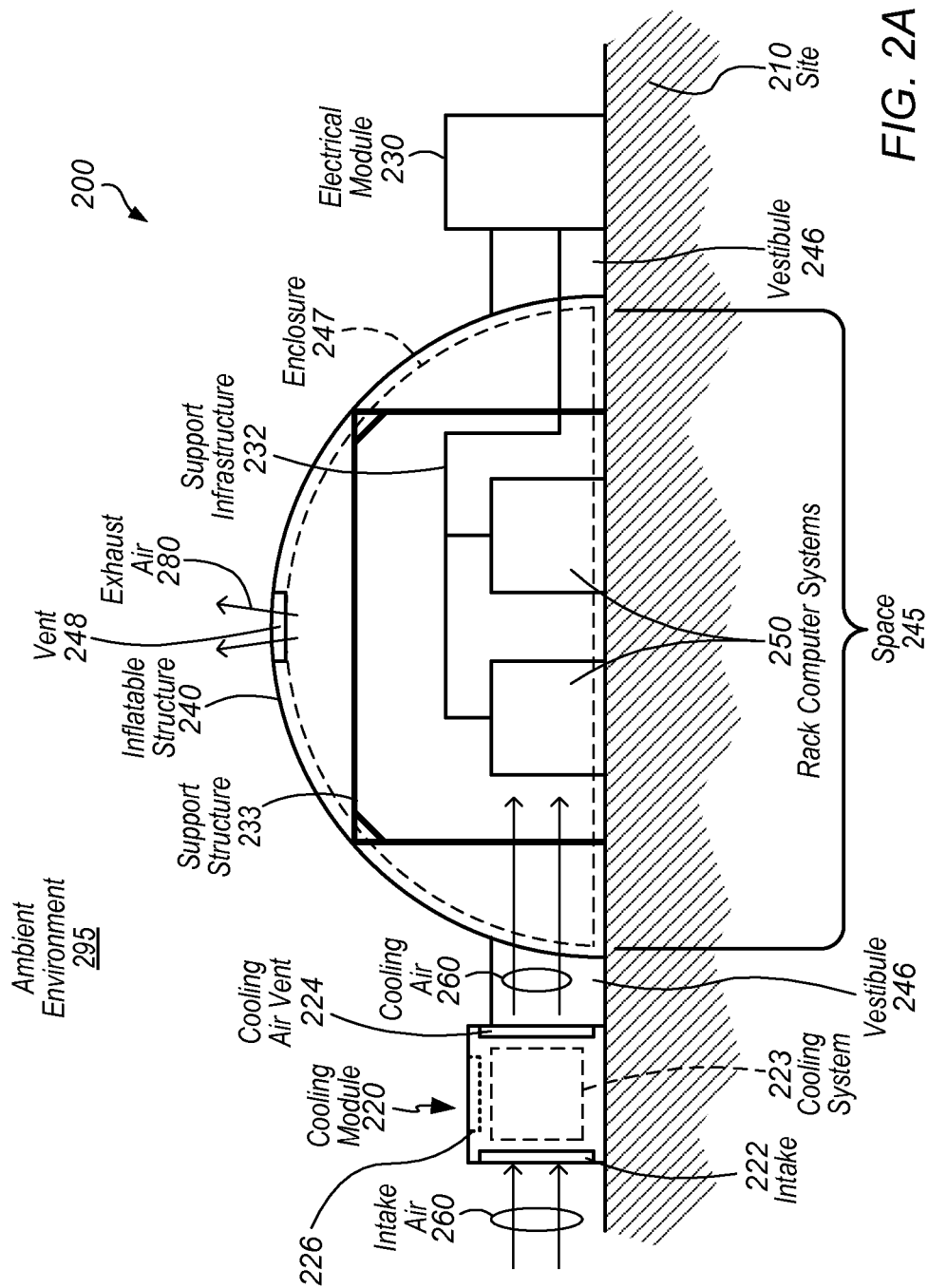
FIG. 2A-B illustrate an orthogonal view of a data center which includes a cooling module, electrical module, and an inflatable enclosure, in which rack computer systems are installed, inflated by cooling air discharged from the cooling module, according to some embodiments.
Figure 2B:
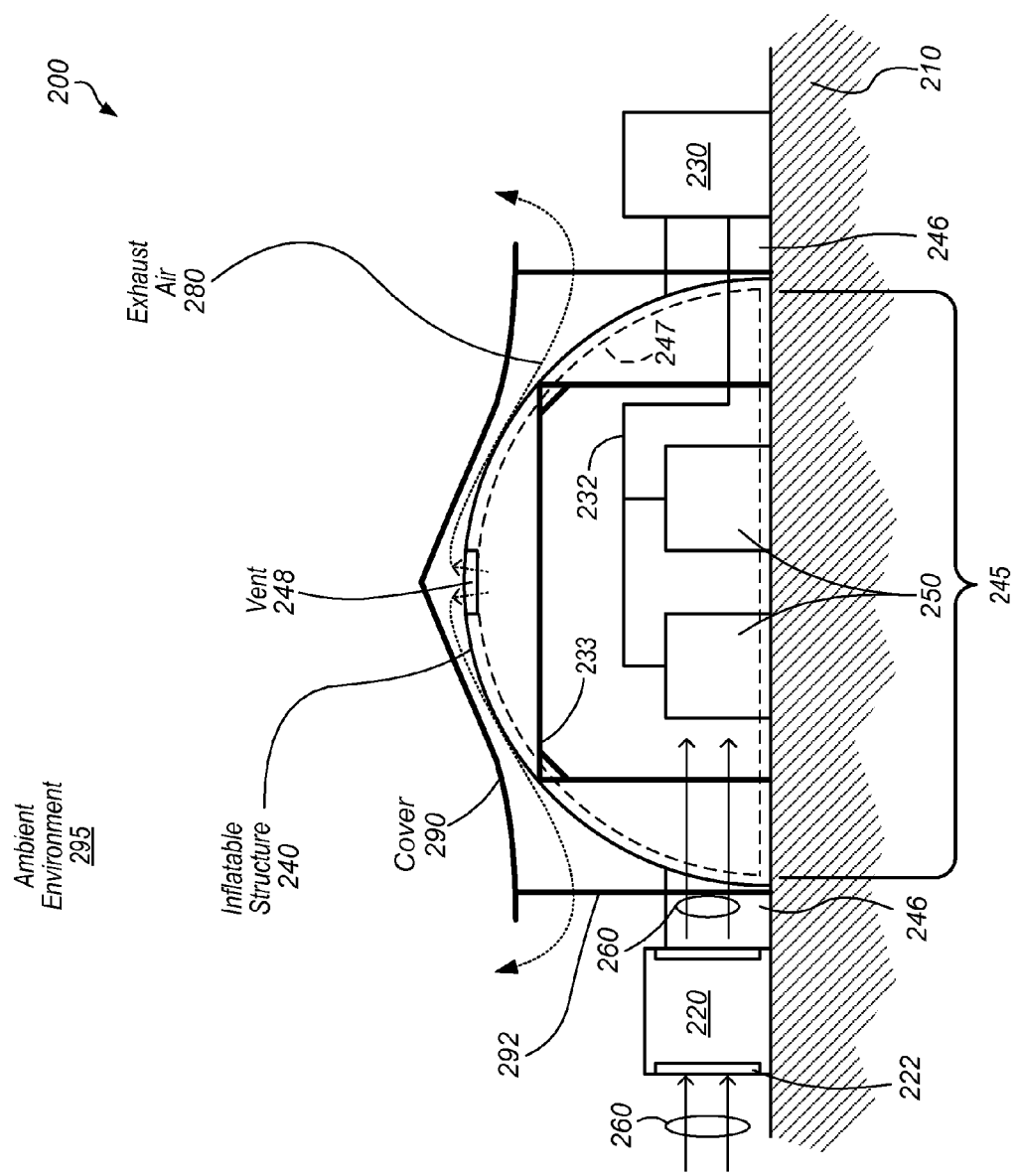

FIG. 2A-B illustrate an orthogonal view of a data center which includes a cooling module, electrical module, and an inflatable enclosure, in which rack computer systems are installed, inflated by cooling air discharged from the cooling module, according to some embodiments.

Data center 200 includes a cooling module 220, electrical module 230, and an inflatable structure 240 which establishes an inflatable enclosure 247 of a space 245 and in which rack computer systems 250 and one or more instances of infrastructure 232, 233 are installed.

In some embodiments, a data center includes modular instances of support infrastructure, also referred to herein as infrastructure modules, which are located externally to an inflatable enclosure in which one or more rack computer systems are installed, where the infrastructure modules each provide one or more types of infrastructure support to the rack computer systems via one or more vestibules which provide an airtight seal between the infrastructure modules and the inflatable enclosure. In some embodiments, an infrastructure module can include one or more cooling modules which are configured to provide cooling support to one or more rack computer systems, one or more electrical modules which are configured to provide one or more of electrical power support to one or more rack computer systems, network communication support to one or more rack computer systems, some combination thereof, etc.

As shown in the illustrated embodiment, the data center 200 includes a cooling module 220, an electrical module 230, and an inflatable structure 240, where the cooling module and electrical module are each positioned on the surface 210 at locations which are adjacent to opposite ends of space 245. The inflatable structure 240 is positioned such that the structure 240 extends across the space 245 and is separately coupled to the separate modules 220, 230 via separate vestibules 246. The vestibules 246 are coupled to the separate modules 220, 230 via airtight connections, such that air within the inflated enclosure 247 is restricted from passing to the ambient environment 295 via the connections between the inflatable structure 240 and the modules 220, 230.

As shown in the illustrated embodiment, the inflatable structure 240, when inflated, encloses the particular space 245, such that the inflated structure 240 at least partially establishes an inflatable enclosure 247 of space 245. Rack computer systems 250 can be installed in the enclosure 247, so that the rack computer systems 250 can perform computing operations and the inflatable structure 240 can partition the enclosure 247 from the ambient environment 295, thereby protecting the rack computer systems 250 from environmental elements.

The electrical module 230 can include one or more power distribution components, including one or more uninterruptible power supplies, transfer switches, power distribution units, generators, etc. and can be coupled to instances of support infrastructure 232. In some embodiments, the electrical module 230 includes one or more instances of network communication infrastructure components, including one or more network switches, etc. such that the electrical module 230 can provide electrical power support and network communication power support to one or more rack computer systems to which the electrical module 230 is coupled via one or more instances of support infrastructure 232.

As shown, the electrical module 230 is coupled to the rack computer systems 250 via one or more instances 232 of support infrastructure which extend through the vestibule 246 which couples the inflatable structure 240 with the electrical module 230. The one or more instances 232 can include one or more power transmission lines which electrically couple the module 230 to the rack computer systems 250, such that the module 230 can provide electrical power support to the rack computer system 250 via the power transmission lines. The one or more instances 232 can include one or more network communication conduits including one or more of network communication cabling, bus trunks, some combination thereof, or the like which communicatively couple the module 230 to the rack computer systems 250, such that the module 230 can provide network communication support to the rack computer system 250 via the network communication conduits. In some embodiments, the electrical module 230 is a pre-fabricated module and includes components housed within a housing which conforms to one or more standardized shipping container form factors.

As shown, the cooling module 220 includes an air intake vent 222 which can direct intake air 260 from the ambient environment 295 into the module 220. The module 220 further includes one or more cooling systems 223 which can at least partially condition the intake air into cooling air 270, which can be discharged, via a cooling air vent 224, into the inflatable enclosure 247 via the vestibule 246 which couples the module 220 to structure 240. The cooling air 270 can remove heat from one or more heat generating components of the rack computer systems 250.

In some embodiments, a cooling module includes intake vents and cooling air vents on various different ends of the cooling module. For example, a cooling module can include intake air vents on a top end of the cooling module. In another example, a cooling module can include intake air vents on multiple ends of the module, including both a top end and a side end. The cooling module 220 shown in FIG. 2A-B includes an intake vent 222 on one side end of the module 220 and a cooling air vent 224 on an opposite side end of the module 220. In some embodiments, intake air vent 222 can be located on a top end of the module 220 as vent 226.

In some embodiments, a cooling module includes multiple cooling air vents on multiple different sides of the cooling module, where the cooling module can be coupled to multiple different inflatable structures on the multiple different ends and can inflate the multiple different inflatable structures, to establish multiple different inflatable enclosures coupled to multiple different ends of the cooling modules. For example, module 220 can include the cooling air vent 224 as shown in FIG. 2A-B, with element 222 being another cooling air vent on an opposite side end of the module 220 with an intake air vent 226 on a top end of the module 220, so that intake air 260 can be drawn downwards into module 220 via vent 226 and can be discharged, as cooling air 260, out of cooling air vents 222, 224 located on different side ends of the module 220. Separate inflatable structures 240 can be coupled to the different side ends of the module 220 on which the different cooling air vents 222, 224 are located, so that the different inflatable structures coupled to the different side ends of the module 220 can be inflated, thereby forming different inflatable enclosures in different spaces next to the different side ends of the module 220, based on the separate streams of cooling air discharged from the different vents 222, 224 located on the different ends of the module 220 into the different spaces.

In some embodiments, the cooling system 223 includes one or more cooling systems which can at least partially condition intake air 260. For example, the cooling system 223 can include an active cooling system, which can include a mechanical cooling system. In another example, the cooling system 223 can include a direct evaporation cooling system. In another example, the cooling system 223 includes a free-cooling system which passes intake air into the enclosure 245 as cooling air 270. In some embodiments, cooling system 223 includes one or more air moving devices which induce a flow of ambient air into the module 220 as intake air 260 and can further induce a flow of one or more streams of cooling air 270 into the enclosure 245. In some embodiments, the cooling module 220 is pre-fabricated module and includes components housed within a housing which conforms to one or more standardized shipping container form factors.

The inflatable structure 240 can include one or more exhaust air vents 248 which discharge exhaust air 280, which has removed heat from one or more heat generating components in the rack computer systems 250 installed in the inflatable enclosure 247, into the ambient environment 295.

In some embodiments, the inflatable structure 240 is at least partially inflated, such that the inflated inflatable structure 240 at least partially encloses the space 245 and establishes the inflatable enclosure 247 of space 245. Where the inflatable structure 240 is coupled to at least one particular side of the cooling module 220 on which one or more cooling air vents 224 are located, the cooling air 270 discharged by one or more cooling air vents 224 can at least partially inflate the structure 240, such that the inflatable enclosure 245 is at least partially established. In some embodiments, one or more of the cooling air vents 224, exhaust vents 248, etc. are independently controllable to maintain an overpressure of the inflatable enclosure 247, relative to the ambient environment, within a particular range of pressure.

In some embodiments, inflating the inflatable structure 240, so that the inflated inflatable structure at least partially encloses a particular space 245 and thereby establishes an inflatable enclosure 247, enables rapid deployment of an enclosure 247 in which rack computer systems 250 can be installed and provide computing capacity. The cooling module 220 can provide both the structural support for the inflatable enclosure 247, via the cooling air 270 discharged into the enclosure 247 which inflates the inflatable structure 240, and cooling support to the rack computer systems 250 installed in the enclosure 247. In addition, electrical modules 230 can be coupled to the structure 240 and provide both at least some infrastructure support to the rack computer systems 250 and at least some anchoring of the inflatable structure 240, such that the inflatable structure 240 is secured over the particular space 245 which is enclosed by the inflatable structure 240. In some embodiments, both the cooling module 220 and the electrical module 230 are coupled to the inflatable structure 240, such that the modules collectively anchor the inflatable structure 240 over the particular space 245.

In some embodiments, the inflatable structure 240 can be coupled to the cooling modules 230 and can be stored, in a compact, deflated state, as part of the cooling module 220, so that the inflatable structure 240 can be transported with the cooling module 220 and delivered to a data center site 210 with the cooling module 220. Deployment of the inflatable structure 240 can include positioning the cooling module 220 at a site 210 and activating at least a portion of the cooling systems 223 included in the module 220, so that the cooling module 220 provides cooling air 270 via one or more cooling air vents 224 and at least partially inflates the inflatable structure 240 which is coupled to the cooling module 220. In some embodiments, the inflatable structure 240 is coupled to a particular side of the cooling module 220 which includes one or more of the cooling air vents 224, so that inducing a stream of cooling air 270 via one or more cooling air vents 224 on the particular side at least partially inflates the inflatable structure 240.

In some embodiments, a data center includes one or more instances of structural support infrastructure installed in the inflatable enclosure. The instances of structural support infrastructure can be installed in the inflatable enclosure subsequent to at least partially inflating the inflatable structure. In some embodiments, installed instances of structural support infrastructure can provide at least some structural support of the inflated inflatable structure in an inflated configuration. For example, as shown in FIG. 2A, support structure 233 can provide at least partial structural support of the inflatable structure 240 in the inflated state, thereby providing at least partial structural support of the inflatable enclosure 247, such that the inflatable structure 240 is precluded from collapsing entirely on the installed rack computer systems 250 if the cooling module 220 at least partially ceases providing cooling air 270 into the space 245. In some embodiments, installed instances of structural support infrastructure can provide at least some structural support of one or more instances of support infrastructure installed in the enclosure. For example, as shown in FIG. 2A, support structure 233 can structurally support one or more instances 232 of infrastructure support, including electrical power transmission lines, network communication conduits, lighting fixtures, etc. in the enclosure 247.

In some embodiments, a data center includes an inflatable structure 240 which includes one or more additional vestibules which are coupled to a portal structure which includes one or more doorways through which an operator can pass through in order to enter or exit the enclosure 247 from an external environment, which can include the ambient environment 295. In some embodiments, various components can be moved into the inflatable enclosure 247, following inflation of structure 240, via a doorway included in the portal structure, including at least some of one or more of rack computer systems 250, infrastructure 232, 233, some combination thereof, etc.

In some embodiments, a data center includes a cover structure, installed over the inflatable enclosure, which diverts environmental elements in the ambient environment, including precipitation, particulate matter, etc., from entering the inflatable enclosure through one or more exhaust vents in the inflatable structure. As shown in FIG. 2B, data center 200 can include a cover structure 290, which is structurally supported by one or more sets of posts 292 over the inflated structure 240 and prevents environmental elements from entering the enclosure 247 from environment 295 via vent 248. For example, vent 248 can include one or more gaps in the structure 240 through which air can pass, and cover 290 can shield the vent 248 from environmental elements. As shown, exhaust air 280 exiting the enclosure 248 via the vent 248 can exit into the environment 295 via passing between the cover 290 and the structure 240 into the environment 295. The cover 290, in some embodiments, is at least partially structurally supported by the inflatable structure 240, and thus can be at least partially structurally supported by air within the enclosure 247 which is at least partially structurally supporting the inflated structure 240.

FIG. 3 illustrates a perspective view of a cooling module which includes multiple independently controllable air moving devices and cooling air vents, according to some embodiments. The cooling module shown in FIG. 3 can be included in any of the embodiments of data centers included in any of the embodiments herein.

In some embodiments, a cooling module which can be included in an inflatable data center, and which can provide cooling air which at least partially inflates an inflatable structure to establish an inflatable enclosure in which rack computer systems can be installed, includes a set of independently controllable cooling air vents which each can direct separate streams of cooling air along separate flow pathways. The separate flow pathways can be parallel, as the separate cooling air vents can be located on a common side of the cooling module. Each cooling air vent can include a separate set of louvers and one or more actuator mechanisms which can be independently controlled, via one or more communicatively coupled computer systems, to adjust the position of the louvers which can, as a result, adjust the flow of cooling air through the respective cooling air vent. In some embodiments, a cooling module can be positioned adjacent to a set of particular spaces, such that separate flow pathways along which separate streams of cooling air are directed from separate cooling air vents are at least partially aligned with separate particular spaces.

In some embodiments, a cooling module which can be included in an inflatable data center, and which can provide cooling air which at least partially inflates an inflatable structure to establish an inflatable enclosure in which rack computer systems can be installed, includes a set of independently controllable cooling systems which each can induce separate streams of cooling air. The separate cooling air streams can be directed out of separate cooling air vents, such that the separate cooling systems can be independently controlled to independently adjust the flow of cooling air provided into separate cooling air pathways. The separate cooling systems can include separate sets of air moving devices which can be independently controlled, via one or more drive motors, etc. to adjust the flow rate of cooling air discharged via one or more cooling air vents into one or more flow pathways.

Cooling module 300 includes a particular side 302 on which separate cooling air vents 350A-D are located and multiple separate portions 320A-D which include a separate cooling air vent 350 and a separate cooling system 330. Each cooling module portion 320A-D includes a separate cooling system 330A-D which can adjustably induce a separate cooling air stream and a separate cooling air vent 350A-D which can adjustably discharge the separate cooling air streams into separate cooling air flow pathways 310A-D. Because the cooling systems and cooling air vents in the separate cooling module portions can be independently controlled, the discharge of cooling air streams into each of the separate flow pathways 310A-D can be independently controlled based at least in part upon independently controlling one or more of the cooling systems and cooling air vents. In some embodiments, the cooling air vents 350 and cooling systems 330 in separate cooling module portions 320 can be separately and independently controlled via one or more computer systems 380 which are communicatively coupled to the module 300 via one or more instances of communication pathways 382.

Each cooling air flow pathway can be based upon the position and orientation of the separate cooling air vents 350. As shown, the cooling air vents 350A-D are each located on a common particular side 302 of the cooling air module and are each facing, in parallel, in a common direction. As a result, the corresponding flow pathways 310A-D are parallel in orientation.

A cooling system 330 in a cooling module portion 320 can include a set of air moving devices 340 which can collectively induce a flow of air through the respective module portion 320. The cooling system 330 can include one or more active cooling systems, free-cooling systems, some combination thereof, etc. which at least partially condition air flowing through the cooling system 330.

In some embodiments, air flow induced by the air moving devices 340 included in a given cooling system 330 in a given cooling module portion 320 can be directed into a flow pathway 310 which corresponds to a separate module portion 320, via a cooling air vent of the separate module portion 320. As a result, air moving devices 340 in multiple separate cooling module portions 320 can induce airflow which is discharged via a common cooling air vent in a particular cooling module portion. In some embodiments, the separate module portions 320 are partitioned from each other, such that cooling air flow streams induced by cooling systems 330 in separate portions 320 are discharged from the module 300 separately into separate flow pathways 310A-D.

In some embodiments, a cooling module 300 includes, in one or more of the cooling module portions 320A-D, one or more attachment components 360A-D, also referred to herein as connectors, which can couple with one or more inflatable structures, such that the one or more inflatable structures are coupled to a particular side 302 of the cooling module 300 on which one or more cooling air vents 350A-D are located. Separate inflatable structures can be coupled to separate attachment components 360A-D on separate cooling module portions 320A-D, so that a given individual inflatable structure coupled to a given cooling module portion 320A-D can be inflated by cooling air discharged into a separate corresponding flow pathway 310A-D by a separate corresponding cooling air vent 350A-D of the given cooling module portion 320A-D. In some embodiments, an individual inflatable structure can be coupled to attachment components 360A-D of multiple separate cooling module portions 320A-D, so that the inflatable structure can be at least partially inflated by cooling air streams discharged from separate cooling air vents 350A-D of separate cooling module portions 320A-D.

FIG. 4A-D illustrate orthogonal views of a data center which includes an inflatable enclosure which is inflated by cooling air discharged from a cooling module and in which rack computer systems and infrastructure are installed, according to some embodiments.

In some embodiments, a data center is rapidly deployed at a data center site via inflation of at least one inflatable structure over a particular space at the site, thereby establishing an inflatable enclosure of the site in which rack computer systems can be installed. The inflatable enclosure can be established more quickly than a fixed enclosure structure can be constructed, thereby enabling rapid deployment of computing capacity at the site.

FIG. 4A illustrates a cooling module 420 being positioned at a particular location 411 at a data center site 410, where the particular location 411 is adjacent to a particular end 418 of a particular space 412 in which computing capacity is to be deployed, via installation of rack computer systems in the space 412. As shown, the cooling module 420 includes a cooling air vent 421, which is located on a particular side 422 of the module 420. The cooling module 420 is positioned at the site 410, in the location 411, in a particular orientation such that the particular side 422, along with the vents 421 included thereon, is adjacent to an end 418 of the particular space 412.

In some embodiments, the cooling module 420 includes a compacted inflatable structure 430 which is coupled to at least the particular side 422 of the module 420. Positioning the module 420 in location 411 at an orientation which positions side 422 adjacent to an end 418 of the particular space 412 positions the compacted inflatable structure 430 adjacent to the same end 418 of the same particular space 412.

In some embodiments, based on positioning the module 420 in the location 411, the inflatable structure 430 can be extended, in a deflated state across at least a portion of the particular space 412 at the site 410. FIG. 4B illustrates the deflated inflatable structure 430 being extended, from the module 420 positioned at location 411, across the space 412. The inflatable structure 430 remains coupled to the particular side 422 of the cooling module 420, so that the inflatable structure 430 can be at least partially inflated by cooling air discharged by the one or more cooling air vents 421 located on the particular side 422 of the cooling module adjacent to the end 418 of the particular space 412.

In some embodiments, the inflatable structure 430 can be extended across the particular space 412 and anchored, at an end 417 which is opposite from the end 418 of the space 412 which is adjacent to the module 420, so that the inflatable structure 430 is secured over space 412. The inflatable structure 430 can be anchored, at end 417, such that an airtight seal is established between structure 430 and the surface of site 410.

FIG. 4C illustrates the inflatable structure 430 being inflated over space 412, such that the inflatable structure 430 establishes an inflatable enclosure 440 of space 412, based on cooling air 464 discharged by the cooling vent 421 of the cooling module 420 into the enclosure 440. The cooling module 420 can include one or more components, including one or more air moving devices, cooling systems, etc. which induce a stream of intake air 462 to flow into the module 420 and can be discharged, as cooling air 464, into the enclosure of space 412 via vents 421. Because the inflatable structure 430 can be coupled to the particular side 422 of the module 420 on which the vents 421 are located, discharging the stream of cooling air 464 out of the vents 421 inflates the structure 430 and establishes the inflatable enclosure 440.

In some embodiments, the inflatable structure 430 includes one or more air vents 450 which discharge at least some air in the enclosure 440 into the ambient environment external to the enclosure 440. The vents 450 can establish a dynamic pressure equilibrium between the inflatable enclosure and the ambient environment such that, for a given flow rate of cooling air into the enclosed space, the exhaust vents 450 discharge a similar flow rate of air into the ambient environment when the internal pressure of the enclosure 440 reaches a particular threshold, such that the enclosed volume of the enclosure 440 remains static.

In some embodiments, the air 466 discharged into the ambient environment by the vents 450 includes exhaust air which comprises cooling air which has removed heat from one or more heat generating components located in the inflatable enclosure 440. As shown in FIG. 4C, the vents 450 can be located at a position on the inflatable structure which positions the vents 450 at an upper position of the enclosure 440 when structure 430 is inflated, such that the warmest air in the enclosure 440 moves to the vent 450 and is discharged into the ambient environment via the vent 450, thereby preventing heat buildup in the enclosure 440.

FIG. 4D illustrates installation of rack computer systems 470 and instances of support infrastructure 482, 484 in the inflatable enclosure 440, where the rack computer systems and support infrastructure provide computing capacity. The support infrastructure includes one or more instances of structural support infrastructure 482 which can include one or more structural members which provide structural support to one or more of the inflatable structure 430, one or more instances of support infrastructure etc. For example, as shown, structural infrastructure 482 provides structural support to instances of infrastructure 484 which comprise electrical power infrastructure which provides electric al power support to the rack computer systems 470. Cooling air 464 discharged into enclosure 440 by the cooling module 420, which also maintains the inflation of the structure 430 which establishes the enclosure 440, further removes heat from one or more heat generating components of one or more rack computer systems 470 in the enclosure 440, thereby generating exhaust air 466 which is directed to the upper portion of the enclosure 440 where the exhaust air can be discharged into the ambient environment via one or more vents 450.

Figure 5:
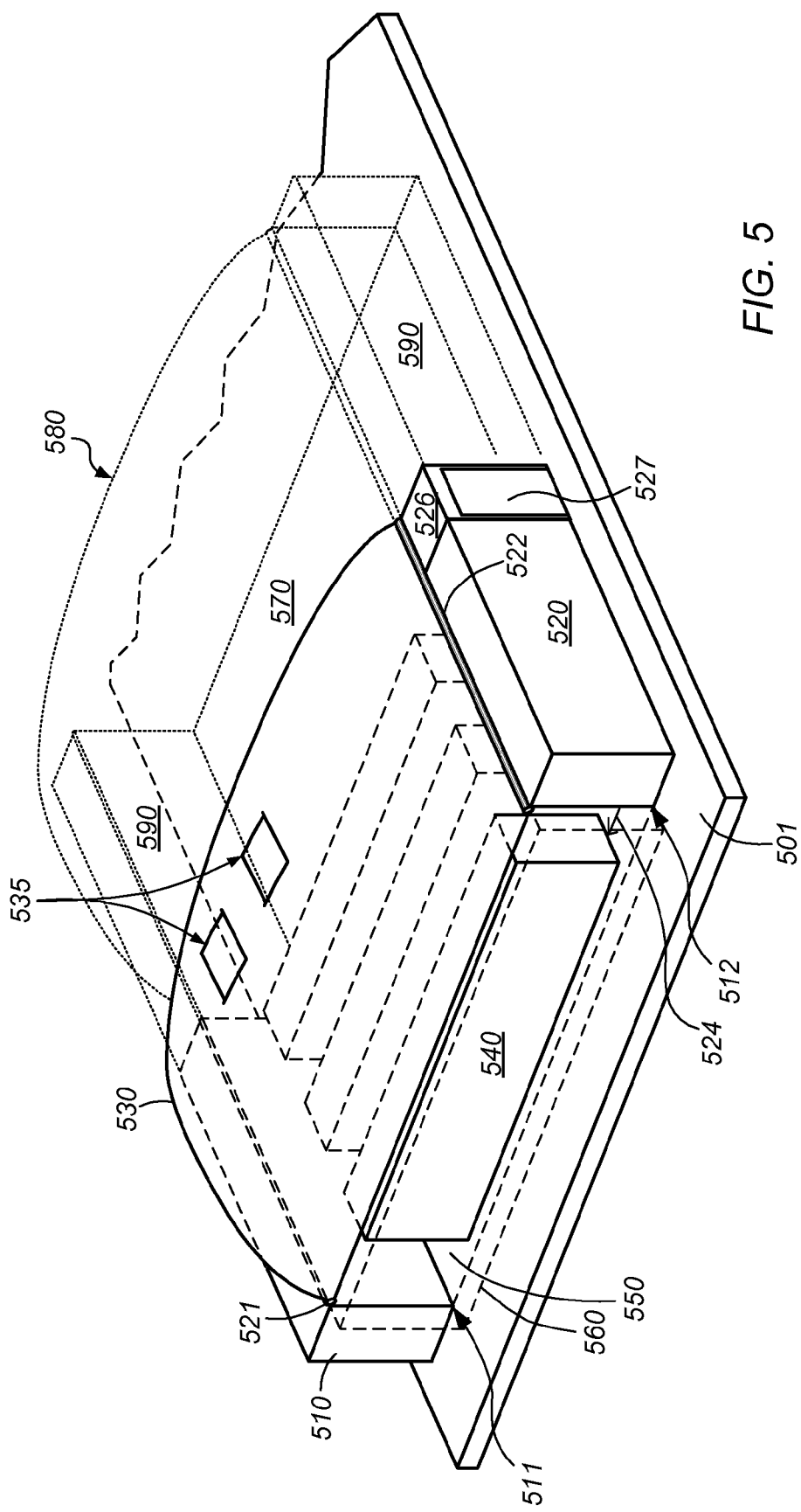
FIG. 5 illustrates a perspective view of a cooling module which includes multiple independently controllable air moving devices and cooling air vents, according to some embodiments.
Figure 6:
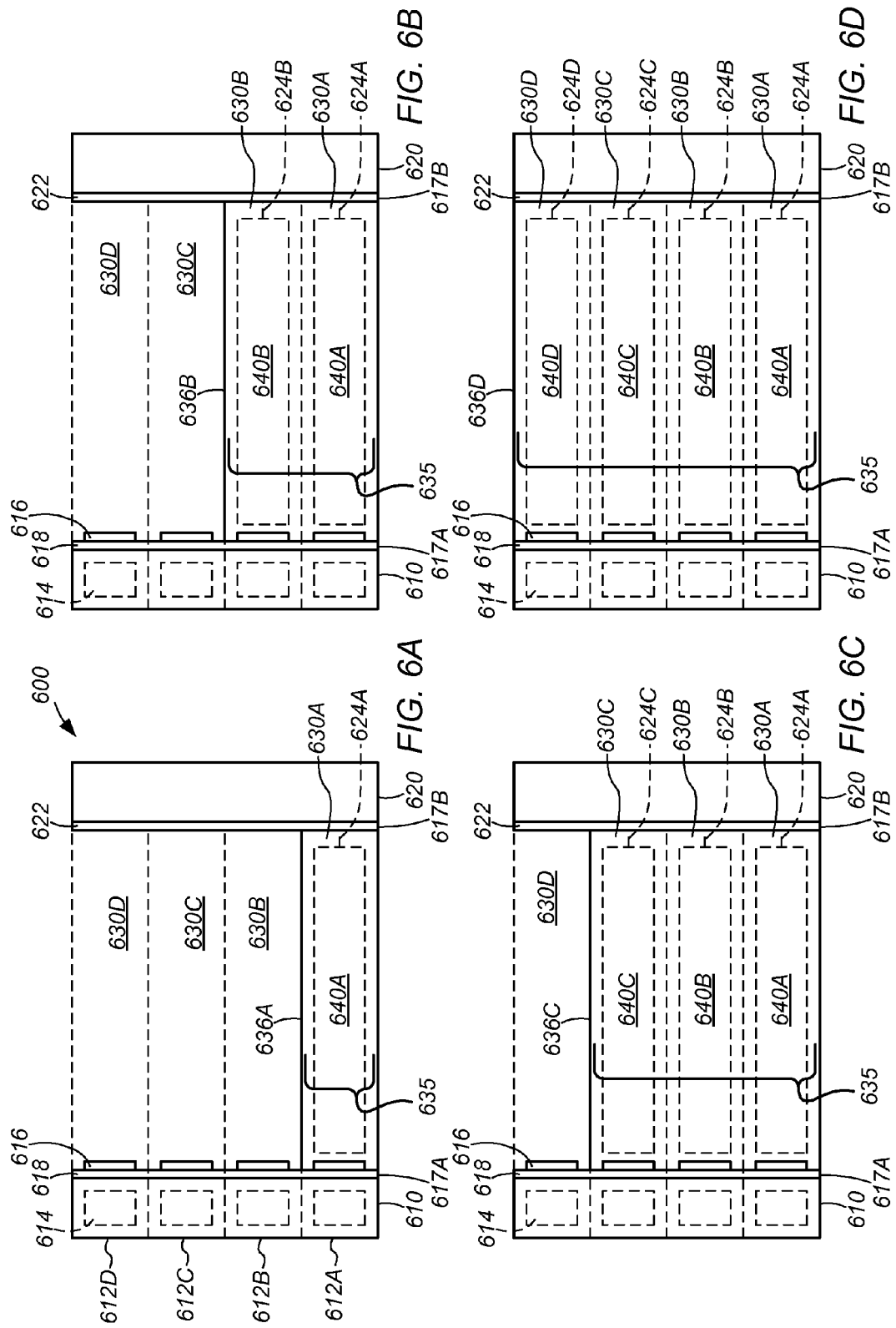
FIG. 6A-D illustrates a data center which includes an inflatable enclosure which is progressively expanded, according to some embodiments.

FIG. 5 illustrates a perspective view of a data center which includes an inflatable structure spanning an inflatable enclosure between a cooling module located at one end of the inflatable enclosure and an electrical module located at an opposite end of the inflatable enclosure, according to some embodiments.

In some embodiments, an inflatable enclosure of a space, in which one or more rack computer systems can be installed, is at least partially established by an inflatable structure which is extended between at least two separate infrastructure modules positioned adjacent to opposite ends of the space, such that the inflatable enclosure is bounded on an upper side by the inflated inflatable structure and bounded on at least two sides by the separate infrastructure modules between which the inflatable structure extends. The inflatable enclosure can be exposed, at one or more sides, to the ambient environment. Such an inflatable enclosure can be rapidly established and expanded, thereby providing rapid deployment of an enclosure in which rack computer systems can be installed.

Data center 500 includes a data center site 501 at which a cooling module 510 and an electrical module 520 are positioned adjacent to opposite ends 511, 512 of a particular space 550, and an inflatable structure 530, which includes exhaust air vents 535, is coupled to connectors 521, 522 extending along separate sides of the modules 510, 520 which are adjacent to the space 550, such that the inflatable structure 530 extends over space 550 between the separate modules 510, 520.

Inflatable structure 530 is inflated, such that the structure 530 at least partially establishes an inflatable enclosure of space 550. Structure 530 is at least partially inflated based on cooling air discharged into space 550 by cooling module 510. As shown, the inflated structure 530 at least partially establishes an upper boundary of the inflatable enclosure of space 550, and modules 510, 520 establish at least two side boundaries of the enclosure. As shown, at least one side boundary of the inflatable enclosure, where the boundary extends along a boundary of space 550 which extends orthogonally to the ends 511, 512, is unenclosed by the modules 510, 520 and structure 530. The unenclosed boundary can be enclosed by one or more sidewall structures 560 which can be installed at the site 801.

Separate rows 540 of rack computer systems are installed in the inflatable enclosure of space 550. Each row 540 is coupled to electrical module 520 via one or more instances of infrastructure support 524, which can include one or more electrical power transmission lines, one or more network communication conduits, some combination thereof, etc., such that the respective row of rack computer systems 540 receives electrical power and network communication support via electrical module 520. In addition, each row 540 of rack computer systems receives cooling support from at least a portion of the cooling module 510 via the cooling air discharged by the module 510 into the space 550, where the cooling air discharged into space 550 at least partially inflates structure 530, thereby at least partially establishing the inflatable enclosure of space 550 in which the rows 540 of rack computer systems are installed.

In some embodiments, the data center includes one or more additional sidewall structures which enclose side boundaries of the space 550 which are unenclosed by the infrastructure modules 510, 520 and the inflated inflatable structure 530. As shown in FIG. 5, a sidewall structure 560 can extend along an end of space 550 which is unenclosed by modules 510, 520 and structure 530. The sidewall structure can provide security protection to the rack computer systems included in one or more of the rows 540 in space 550, based at least in part upon obstructing exterior access to space 550.

In some embodiments, additional infrastructure modules and inflatable structure can be installed in a data center to progressively expand the infrastructure support capacity of the data center, the enclosed space of the data center, and the computing capacity of the data center. Such expansion can include positioning one or more additional infrastructure modules at the data center site at a position which is adjacent to an additional particular space, where the additional particular space is adjacent to an inflatable enclosure, and establishing an inflatable enclosure of the additional particular space.

As shown in the illustrated embodiment of FIG. 5, additional infrastructure modules 590 can be positioned at locations adjacent to additional space 570, where additional space 570 is adjacent to an end of space 550 which is unenclosed by modules 510, 520, and structure 530, so that an inflatable structure can be extended over, and inflated over, space 570 to establish an inflatable enclosure of space 570, thereby resulting in data center 500 including two adjacent inflatable enclosures of spaces 550, 570. As further shown, additional module 590 can be adjacent to both space 570 and installed infrastructure module 520. Module 590 can be a common infrastructure as the adjacent infrastructure module, such that infrastructure support provided by the additional module 590 can be provided to one or more rack computer systems via the previously-installed infrastructure module. For example, where module 520 is an electrical module, additional module 590 can be an electrical module which is electrically coupled to electrical module 520, so that module 590 can provide one or more of electrical power support and network communication support to the rack computer systems 540 installed in space 550 via module 520 and instances of infrastructure 524. As a result, in some embodiments, where additional infrastructure support is needed to support rack computer systems installed in a given space enclosed by an inflatable enclosure, and an additional enclosed space is not required, an additional infrastructure module 590 can be positioned at site 501 and coupled to a previously-installed infrastructure module 510, 520 which is configured to provide a common type of infrastructure support, such that the additional infrastructure module 590 can provide infrastructure support to the rack computer systems in the enclosed space via one or more previously-installed infrastructure modules 510, 520.

In some embodiments, a data center includes one or more portal modules, also referred to as security modules, which include one or more doors through which an operator can pass to enter or exit the inflatable enclosure from an external environment. As shown in FIG. 5, a security module 526 which includes an extension of connector 522 is coupled to the electrical module 520, so that connector 522 is formed from a coupling of respective connectors of modules 520, 526. The inflatable structure 530 is extended along the connector 522, so that one end of the structure 530 is coupled to both modules 520, 526. As shown, module 526 includes a doorway 527 through which an operator can pass to enter or exit the enclosure of space 550.

In some embodiments, various components can be moved into or out of the inflatable enclosure of space 550, following inflation of structure 530, via the doorway 527 of module 526, including at least some of one or more of rack computer systems included in rows 540, infrastructure 524, some combination thereof, etc.

In some embodiments, multiple separate inflatable structures are extended over separate particular spaces at the data center site, so that each separate inflatable structure encloses at least a separate upper boundary of a separate particular space and the multiple inflatable structure collectively enclose the upper boundary of the contiguous particular spaces. The separate inflatable structures can be coupled together to establish a single collective inflatable structure.

FIG. 6A-D illustrate a data center which includes an inflatable enclosure which is progressively expanded, according to some embodiments. The data center shown in FIG. 6A-D can include any of the embodiments of inflatable structures, infrastructure modules, etc. included herein.

In some embodiments, an inflatable enclosure of a data center can be progressively expanded, over time, to progressively enclose additional space in which rack computer systems can be installed. As a result, the size of the inflatable enclosure can be tailored to correspond to the quantity of rack computer systems installed in the data center, and the enclosure can be rapidly expanded to enclose additional space as additional space is needed in which to install additional rack computer systems, instances of support infrastructure, etc.

Because the amount of cooling air required to maintain inflation of the inflatable enclosure can be associated with the volume of the inflatable enclosure, an inflatable enclosure which encloses a minimally-sufficient amount of space which is minimally sufficient to accommodate the rack computer systems installed in the data center can result in a more efficient use of cooling infrastructure resources than inflating an inflatable enclosure which is of sufficient size to accommodate the maximum quantity of rack computer systems which can be installed in the data center but results in excess, unused space when the number of rack computer systems installed in the data center is progressively expanded based on computing requirements at the data center.

Because the enclosure is inflatable, expansion of the inflatable enclosure can be more rapid than expansion of an enclosure established by a fixed structure, as the expansion can include extending an inflatable structure across the additional space through which the inflatable enclosure is to be expanded and inflating the inflatable structure in the additional space.

FIG. 6A-D illustrates establishing an inflatable enclosure over a particular space at data center site and installing at least one rack computer system in the particular space, and progressively expanding the inflatable enclosure over additional spaces at the data center site, where additional rack computer systems are installed in the additional spaces. Rack computer systems are installed a particular space as the inflatable enclosure expands such that the inflatable enclosure at least partially encloses the particular space.

FIG. 6A shows a top-down view of a data center site 600 which includes a set of spaces 630A-D. A cooling module 610 is positioned at a location at site 600 which positions the module 610 adjacent to a particular end 617A of the spaces 630A-D. Cooling module 610 includes multiple cooling module portions 612A-D which correspond to the separate spaces 630A-D. Each separate module portion 612A-D includes a separate cooling system 614, which can include a separate set of air moving devices. Each separate module portion 612A-D includes a separate cooling air vent 616 which discharges a separate cooling air stream induced by the respective cooling system 614 of the respective portion 612A-D. As shown, each separate cooling air vent 616 can discharge a separate cooling air stream, induced by a separate cooling system, into a separate space 630. In particular, each separate cooling air vent 616 can discharge separate cooling air streams, in parallel, into four separate spaces 630A-D.

As shown, cooling module 610 is positioned at a particular location and orientation at site 600 which results in the particular side of module 610 on which the vents 616 are located being adjacent to a particular end 617A of each of the particular spaces 630A-D of the site 600, where the module 610 is positioned so that each separate cooling air vent 616 of the separate portions 612A-D can discharge a separate stream of cooling air into a separate space 630A-D.

As shown, an electrical module 620 is positioned at a particular orientation at site 600 which results in a side of the electrical module 620 which is configured to couple with one or more instances 624 of instructor support being adjacent to a particular end 617B of each of the particular spaces 630A-D of the site 600. As shown, the electrical module 620 is positioned at a location which is adjacent to an end 617B of the spaces 630A-D which is opposite from the end 617A of the spaces 630A-D to which the cooling module 610 is adjacently positioned. As shown, the particular end 617A of the spaces 630A-D to which the cooling module 610 is adjacent is an opposite end of the spaces 630A-D, relative to the particular end 617B of the spaces 630A-D to which the electrical module 620 is adjacently positioned, such that opposite ends 617A-B of each particular space 630A-D are adjacent to a separate one of the cooling module 610 and the electrical module 620.

In some embodiments, an inflatable structure can be extended, over a particular space at a data center site, between separate infrastructure modules coupled to opposite ends of the particular space, such that the inflatable structure encloses at least an upper end of the particular space of the data center site. Cooling air can be discharged into the at least partially enclosed space, from at least one cooling air vent of at least one cooling module, so that the cooling air inflates the inflatable structure and the inflated structure establishes an inflatable enclosure of the particular space.

Extending an inflatable structure over a particular space between separate infrastructure modules coupled to opposite ends of the particular space can include coupling the inflatable structure to each of the separate infrastructure modules. As shown at FIG. 6A, cooling module 610 includes a connector 618 which extends along the particular side of the module 610 on which the cooling air vents 616 are located and which is located adjacent to a particular end 617A of each of the particular spaces 630A-D. In addition, electrical module 620 includes a connector 622 which extends along the particular side of the module 620 which is located adjacent to another particular end 617B of each of the particular spaces 630A-D.

As shown in FIG. 6A, an inflatable structure 635 is coupled to the portion of the connector 618 which is included in module portion 612A and is extended over the particular space 630A adjacent to portion 612A of module 610. Inflatable structure 635 is further coupled, at an opposite end relative to the end coupled to connector 618, to a portion of the connector 622 of the electrical module 620 which is adjacent to the end of space 630A which is adjacent to module 620. As a result, inflatable structure 635 extends over space 630A between modules 610, 620, such that the inflatable structure 635A establishes an upper boundary of an enclosure of space 630A.

The cooling system 614 included in module portion 612A can induce a stream of cooling air, which can be discharged by cooling air vent 616 of portion 612A into space 630A enclosed, at least on an upper boundary of an enclosure of space 630A, by inflatable structure 635. The discharged cooling air in space 630A can inflate the structure 635, thereby establishing an inflatable enclosure of space 630A. As further shown in FIG. 6A, a row of rack computer systems 640A is installed in the inflatable enclosure of space 630A, and an instance of infrastructure support 624 is installed in space 630A to couple the row of rack computer systems 640A to electrical module 620, such that the installed row of rack computer systems 640A receive cooling support via the cooling module portion 610 and electrical and network communication support via the electrical module 620.

As shown in FIG. 6A, inflatable structure 635 extends to a boundary 636A between spaces 630A and 630B. In some embodiments, inflatable structure 635 includes a horizontally-oriented portion which extends over space 630A, and establishes an upper boundary of an inflatable enclosure of space 630A and a vertically-oriented portion which extends along the boundary 636A and at least partially establishes a side boundary of the inflatable enclosure of space 630A.

In some embodiments, an inflatable enclosure is progressively expanded from the initially enclosed space 630A to enclose additional spaces 630B-D. Each progressive expansion can be associated with a determination that additional computing capacity is needed at site 600, such that an additional row of rack computer systems 640 is required to be installed at the site 600 and an additional space 630 is required to be enclosed to support the additionally-installed rack computer systems.

FIG. 6B-D illustrate progressively expanding the inflatable enclosure to enclose spaces 630A-D. Each expansion can include extending at least one inflatable structure 635 over the additional spaces 630 at the site, inflating the at least one inflatable structure 635 over the additional spaces 630, and installing one or more rows of rack computer systems 640A-D in the enclosed additional spaces, where the installing includes installing separate instances of infrastructure support 624A-D coupling the rows 640A-D to the electrical module 620.

As shown at FIG. 6B, the inflatable structure 635 is extended from enclosing space 630A to boundary 636B so that the structure 635 additionally encloses space 630B, so that structure 635 encloses at least the upper boundary of spaces 630A-B. Cooling air streams can be discharged into spaces 630A-B, via separate cooling air vents 616 of separate cooling module portions 612A-B, such that the inflatable enclosure is expanded to comprise a contiguous inflatable enclosure of spaces 630A-B. As further shown in FIG. 6B, an additional row of rack computer systems 640B is installed in the enclosed space 630B and coupled to electrical module 620 via instances 624A-B. FIGS. 6C and 6D further illustrate progressively extending the inflatable structure over space 630C, to boundary 636C, and space 630D, to boundary 636D, so that, at FIG. 6D, the inflatable structure 635 encloses an upper boundary of spaces 630A-D, the structure 635 is inflated by cooling air discharged from cooling air vents 616 of cooling module 610, and a row of rack computer systems 640 is installed in each space 630 enclosed by the inflatable enclosure.

In some embodiments, extending the inflatable structure 635 over additional spaces 630A-D of the site 600 includes extending opposite ends of the structure 635 along connectors 618, 622 of infrastructure modules 610, 620 positioned adjacent to opposite ends of the spaces 630A-D. In some embodiments, connectors 618, 622 each comprise a separate rail structure along which a separate end of the inflatable structure 635 can be extended.

Figure 7:
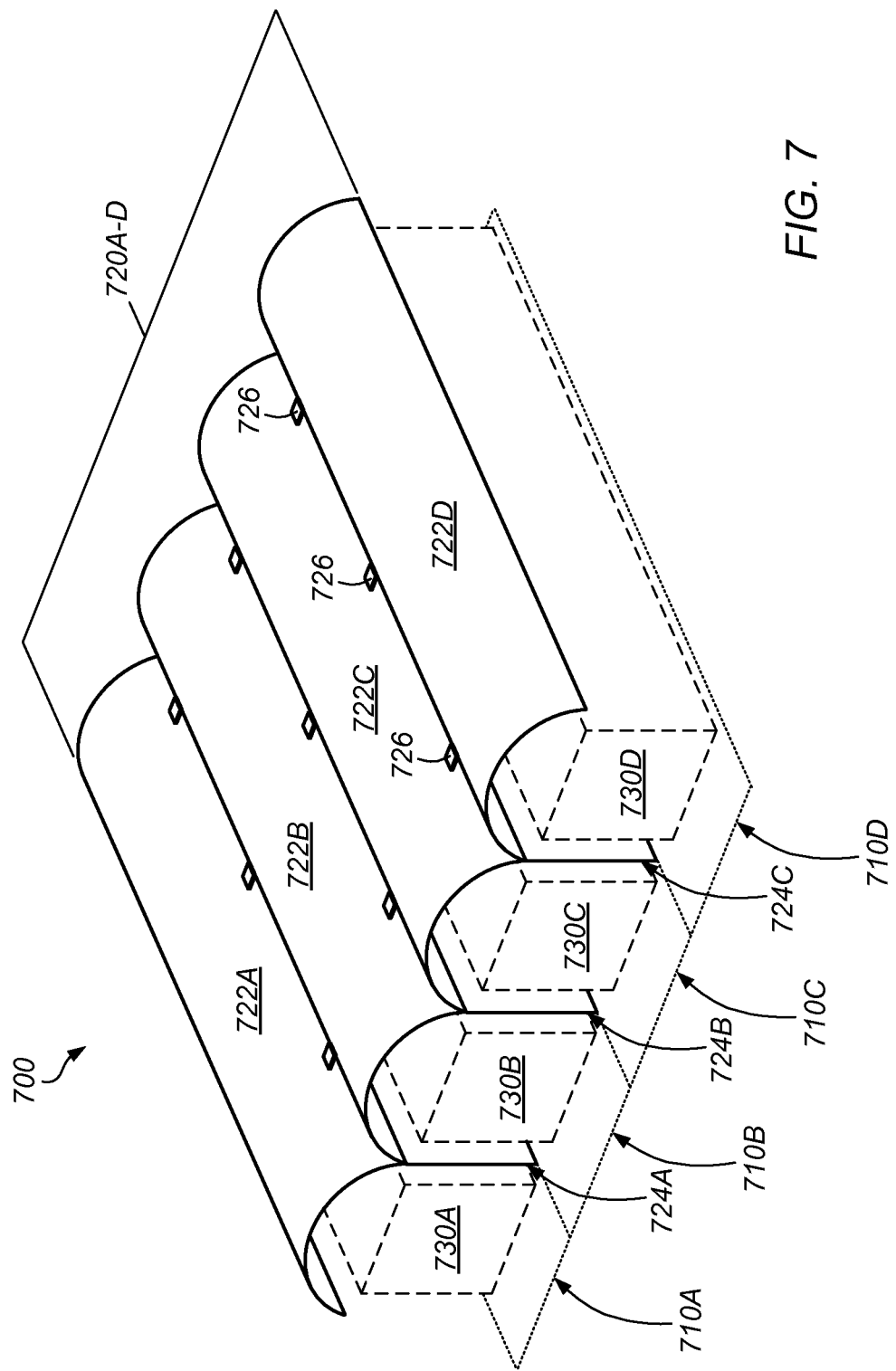
FIG. 7 illustrates a perspective view of inflatable structures which enclose multiple, separate adjacent inflatable enclosures, according to some embodiments.

FIG. 7 illustrates a perspective view of inflatable structures which enclose multiple, separate adjacent inflatable enclosures, according to some embodiments. The inflatable structures can be included in any of the embodiments of inflatable structures included herein.

A collective inflatable enclosure 700 which collectively encloses multiple adjacent inflatable enclosures of multiple adjacent spaces 710A-D includes multiple separate inflatable structures 720A-D, where each separate inflatable structure 720 establishes an inflatable enclosure of a separate space 710, and the separate inflatable structures 720A-D are coupled together to establish the collective inflatable enclosure 700.

A separate row of rack computer systems 730A-D is installed in each separate space 710A-D. In addition, each separate inflatable structure 720A-D includes a horizontally-oriented portions 722A-D and a vertically-oriented portion 724A-D. The horizontally-oriented portion 722 of a given inflatable structure can enclose an upper boundary of a given space 710, and the vertically-oriented portion 724 of the given inflatable structure can enclose at least one side boundary of the given space. In some embodiments, each inflatable structure 720 includes a vertically-oriented portion 724 which extends along a boundary between separate spaces 730.

In some embodiments, each separate inflatable structure 720A-D includes a set of connectors 726 which couple one or more portions of the given inflatable structure to one or more portions of another inflatable structure, such that the coupled inflatable structures collectively establish an inflatable enclosure of multiple adjacent spaces. As shown, the inflatable structures 720A-D are each coupled together, at adjacent connectors 726, such that the coupled structures 720A-D collectively establish an inflatable enclosure 700. In some embodiments, the connectors 726 are included in the horizontally-oriented portion 722A-D of the respective structures 720A-D. For example, coupling inflatable structure 720A to inflatable structure 720B via connectors 726 included in the portions 722A-B of the respective structures 720A-B results in coupling the portions 722A-B of the respective structures. A connector 726 can include one or more various types of connectors, including a set of Velcro connectors on separate structures 720 which can couple together to couple the structures 720, a set of hook and loop connectors, a set of zipper connectors, hanger links, etc.

In some embodiments, a vertically-oriented portion 724 of an inflatable structure 720 is removably coupled to the horizontally-oriented portion 722 of the structure 720, such that the portion 724 can be decoupled from portion 722 of a structure 720 when the given structure is coupled to another inflatable structure, such that the coupled inflatable structures 720 collectively enclose a continuous combination of adjacent spaces without an internal partition between the adjacent spaces. For example, where inflatable structure 720B is coupled to structure 720A, via coupling connectors 726 of horizontally-oriented portions 722A-B together, the vertically-oriented portion 724A of structure 720A can be decoupled from portion 722A, such that the horizontally-oriented portions 722A-B of structures 720A-B at least partially establish an inflatable enclosure of spaces 710A-B which does not include an interior partition between the spaces 710A-B.

Figure 8:
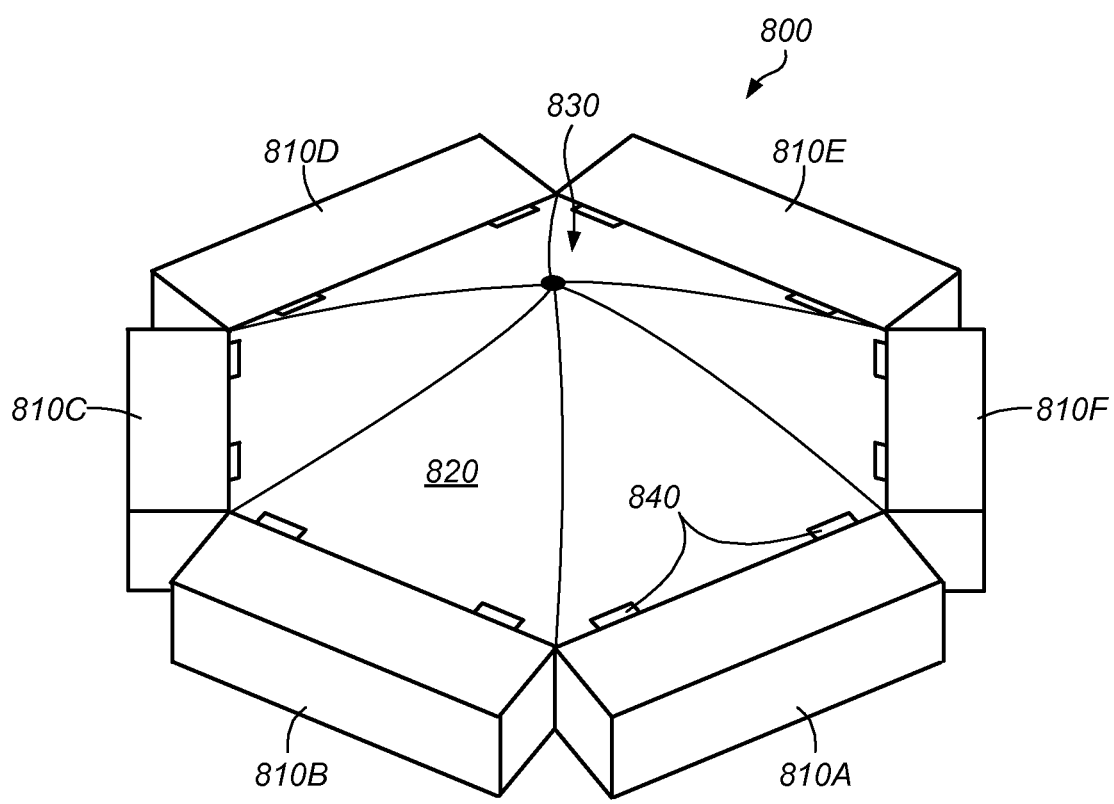
FIG. 8 illustrates a data center which includes multiple modules which bound an interior space which is at least partially enclosed by an inflatable structure, according to some embodiments.

FIG. 8 illustrates a data center which includes multiple modules which bound an interior space which is at least partially enclosed by an inflatable structure, according to some embodiments.

In some embodiments, a data center includes a set of rigid modules which are arranged in a configuration which surrounds a particular space and an inflatable structure which encloses an upper portion of the space. The rigid modules can include various quantities of modules, so that an arrangement of rigid modules which surrounds a particular space can have one or more various shapes. For example, the data center 800 shown in FIG. 8 includes a set of six rigid modules 810A-F which are arranged to surround a particular space 820, so that the particular space 820 is hexagonal in shape.

In some embodiments, a data center includes an inflatable structure which is coupled to at least some of the rigid modules arranged to surround the particular space, so that the inflatable structure, when inflated by cooling air discharged by one or more cooling modules included in the rigid modules, establishes an inflatable enclosure of the particular space. The inflatable structure can be coupled to each of the rigid modules, such that the inflatable structure is anchored on every side of the particular space. In the illustrated embodiment, for example, the data center 800 includes an inflatable structure 830 which includes separate sets of connectors 840 on separate edges, where each separate set of connectors 840 can be coupled to a separate module of the rigid modules 810A-F, so that the inflatable structure 830 is secured to each of the rigid modules 810.

In some embodiments, each set of connectors 840 on the separate edges of the inflatable structure 830 is configured to establish an airtight seal between the respective inflatable structure edge and the corresponding rigid module to which the connectors are coupled. As a result, coupling each set of connectors on the separate edges of the inflatable structure 830 to the separate rigid modules can establish an airtight seal between the inflatable structure 830 and the rigid modules 810.

The arrangement of rigid modules can include multiple separate housings which include different sets of components which provide different types of infrastructure support. For example, rigid modules 810A, 810C, and 810E can each include a separate cooling system and each discharge a separate cooling air stream into space 820 via separate, independently controllable sets of cooling air vents. In another example, rigid modules 810B and 810D can each include separate power distribution components and network communication components and each provide electrical power support and network communication support to at least some of a set of rack computer systems installed in space 820. In another example, rigid module 810F can include an office space which includes computer systems which can provide operators with information, via one or more display interfaces, regarding one or more of cooling support, electrical power support, network communication support of one or more rack computer systems installed in the space 820. It will be understood that other arrangements of cooling systems, power distribution components, network communication components, and office spaces within the various rigid modules surrounding the enclosed space are encompassed herein.

Figure 9:
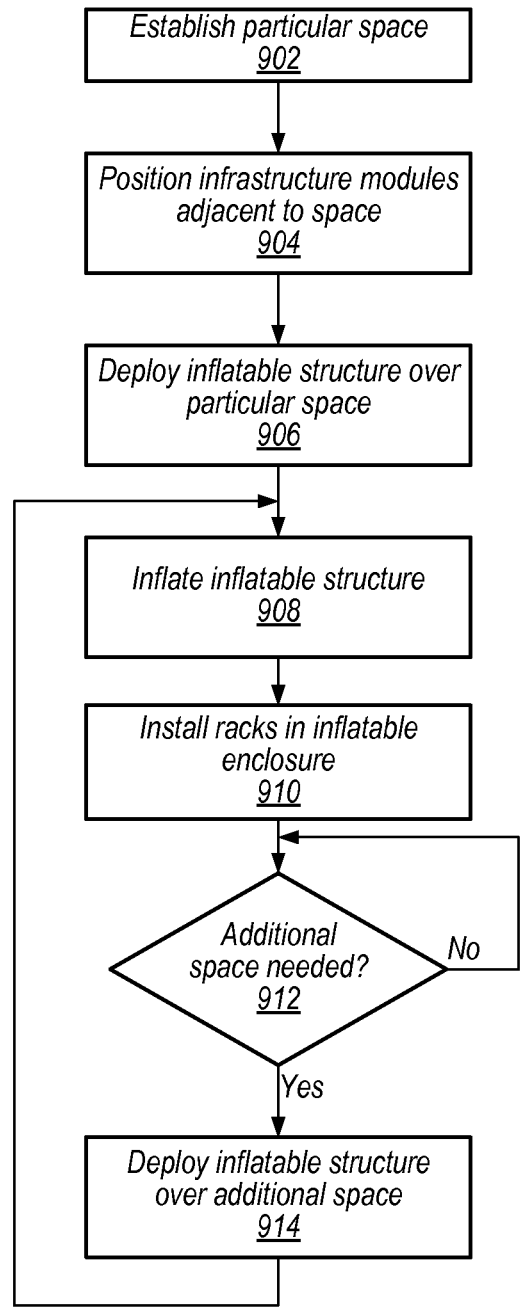
FIG. 9 illustrates deploying a data center, according to some embodiments.

FIG. 9 illustrates deploying a data center, according to some embodiments. The deploying can be implemented with regard to any of the data centers included in any of the embodiments included herein.

At 902, a particular space is established at a particular site. The site can include a prepared surface, including a concrete surface, which is configured to structurally support one or more of rack computer systems, power distribution components, network communication components, etc. In some embodiments, the particular site is a site at which a data center is to be deployed; such a site can be referred to as a data center site.

In some embodiments, establishing a particular space includes establishing a set of particular spaces at the site, such that at least a portion of the particular site is partitioned into multiple separate particular spaces. The multiple spaces can be contiguous, such that at least some of the spaces are adjacent to each other. Each separate space can have a size and shape which is configured to accommodate a separate set of one or more rows of rack computer systems and associated instances of support infrastructure, including power transmission lines, network communication conduits, support structures, lighting, etc.

At 904, one or more infrastructure modules are positioned, at the particular site, adjacent to at least one end of the particular space. Infrastructure modules can each include a module which includes components configured to provide at least one instance of infrastructure support performance of computing operations by one or more rack computer systems.

For example, an infrastructure module can include a cooling module which is configured to provide cooling support to one or more rack computer systems, where the cooling module includes one or more intake air vents which is configured to receive ambient air into the module, one or more cooling systems which is configured to condition the received intake air to generate cooling air, and one or more cooling air vents which is configured to discharge cooling air from the module.

In another example, an infrastructure module can include an electrical module which is configured to provide one or more of electrical power support, network communication support, etc. to rack computer systems. To be configured to provide electrical power support, the electrical module can include one or more of an electrical power feed connector which can couple with an electrical power feed, one or more power distribution components, an electrical distribution feed connector which can couple with one or more rack computer systems via one or more instances of power transmission line infrastructure, etc. To be configured to provide network communication support, the electrical module can include one or more of a network switching device, network communication interface, etc.

In some embodiments, positioning one or more infrastructure modules includes positioning one or more infrastructure modules at respective locations adjacent to one or more ends of the particular space. For example, a cooling module can be positioned at a location which is adjacent to one end of the particular space, and in an orientation such that one or more cooling air vents of the cooling module face towards the particular space. As a result, the cooling module can be positioned to configure the cooling module to discharge cooling air into the particular space. In another example, a cooling module and electrical module are positioned at locations adjacent to opposite ends of the particular space.

At 906, an inflatable structure is deployed over the particular space. Deploying the inflatable structure can include extending an initially compacted inflatable structure across the surface area of the portion of the particular site which establishes a lower surface of the particular space.

In some embodiments, the inflatable structure comprises at least one flexible sheet structure which can be coupled to at least one infrastructure module and extended from the infrastructure module across the particular space and coupled to an anchoring structure on an opposite side of the particular space. The anchoring structure can include another separate infrastructure module, a stand-alone structure, an anchoring device which is secured on a surface, etc. In some embodiments, the inflatable structure is a balloon-type structure which includes material which encloses an interior, where gases can be introduced into the interior to inflate the structure.

In some embodiments, deploying the inflatable structure can include coupling one or more connectors of the inflatable structure to one or more sides of an infrastructure module. The inflatable structure can be coupled to a particular side of a cooling module which includes one or more cooling air vents, so that cooling air discharged by the one or more cooling air vents can at least partially inflate the inflatable structure.

At 908, the inflatable structure is inflated, so that the inflated inflatable structure at least partially encloses the particular space and establishes an inflatable enclosure bounded by at least the inflatable structure. Inflation of the inflatable structure can include operating one or more cooling systems, air moving devices, cooling air vents, etc. in a cooling module positioned adjacent to the particular space at 904, such that cooling air is discharged by one or more cooling air vents of the cooling module into the particular space and at least partially inflates the inflation structure.

At 910, one or more rack computer systems are installed in the inflatable enclosure, such that the rack computer systems can perform computing operations. Installation of a rack computer system in the inflatable enclosure includes positioning one or more rack computer systems on the particular space which is enclosed in the inflatable enclosure and coupling the rack computer systems to one or more instances of power support infrastructure and network communication infrastructure, such that the rack computer systems are configured to receive electrical power and are configured to communicate with one or more communication networks. Installed rack computer systems can receive cooling support via the cooling air discharged by a cooling module into the inflatable enclosure where, in addition to at least partially inflating the inflatable structure, the cooling air removes heat from one or more heat generating components included in the one or more rack computer systems.

At 912 and 914, if additional space is needed to install one or more additional rack computer systems, an additional particular space at the site is selected, and an inflatable structure is deployed over the additional space. The inflatable structure deployed over the additional space can include the same inflatable structure deployed over the particular space, where the inflatable structure is extended over the additional space so that the inflatable structure extends over both the particular space and the additional space. In some embodiments, an additional inflatable structure is deployed over the additional space, such that the initial inflatable structure establishes the inflatable enclosure of the particular space and the additional inflatable structure, when inflated, establishes an inflatable enclosure over the additional space.

In some embodiments, an inflatable structure includes a horizontally-oriented portion which is configured to enclose an upper portion of the inflatable enclosure and a vertically-oriented portion which is configured to enclose a side portion of the inflatable enclosure. The vertically-oriented portion can be reversibly detachable from the horizontally-oriented portion, and the horizontally-oriented portion can include one or more connectors which can be coupled with one or more horizontally-oriented portions of one or more other inflatable structures, such that extending the inflatable enclosure can include coupling a horizontally-oriented portion of an additional inflatable structure to a horizontally-oriented portion of a deployed and inflated inflatable structure, and further decoupling the vertically-oriented portion of the deployed and inflated inflatable structure from the upper portion of the deployed inflatable structure, such that the horizontally-oriented portions of the deployed inflatable structure and the additional inflatable structure collectively establish a contiguous inflatable enclosure of both the particular space and the additional space.

In some embodiments, inflating an inflatable structure over an additional space at 908 includes independently controlling one or more cooling systems, cooling vents, etc. included in one or more cooling modules so that an independent stream of cooling air is discharged, separately from the cooling air stream discharged into the particular space, into the additional space so that the inflatable structure extended over the additional space is at least partially inflated by a cooling air stream discharged into the additional space. In some embodiments, one or more cooling systems are independently controlled to adjust the total flow of cooling air into the particular space and additional space, based at least in part upon extension of the inflatable enclosure to enclose the additional space.

If in some embodiments, there is not enough infrastructure support, provided by at least one instance of infrastructure, one or more additional infrastructure modules are positioned at the data center site such that sufficient infrastructure support to support the one or more additional rack computer systems is available at the data center site. Infrastructure modules configured to provide a common type of infrastructure support can be positioned adjacent to each other. For example, where a first cooling module is positioned adjacent to a first end of the particular space, a second cooling module can be positioned adjacent to the first cooling module and to the first end of the particular space, such that at least one particular side of each cooling module, which includes at least one cooling air vent, faces towards the particular space.

Figure 10:
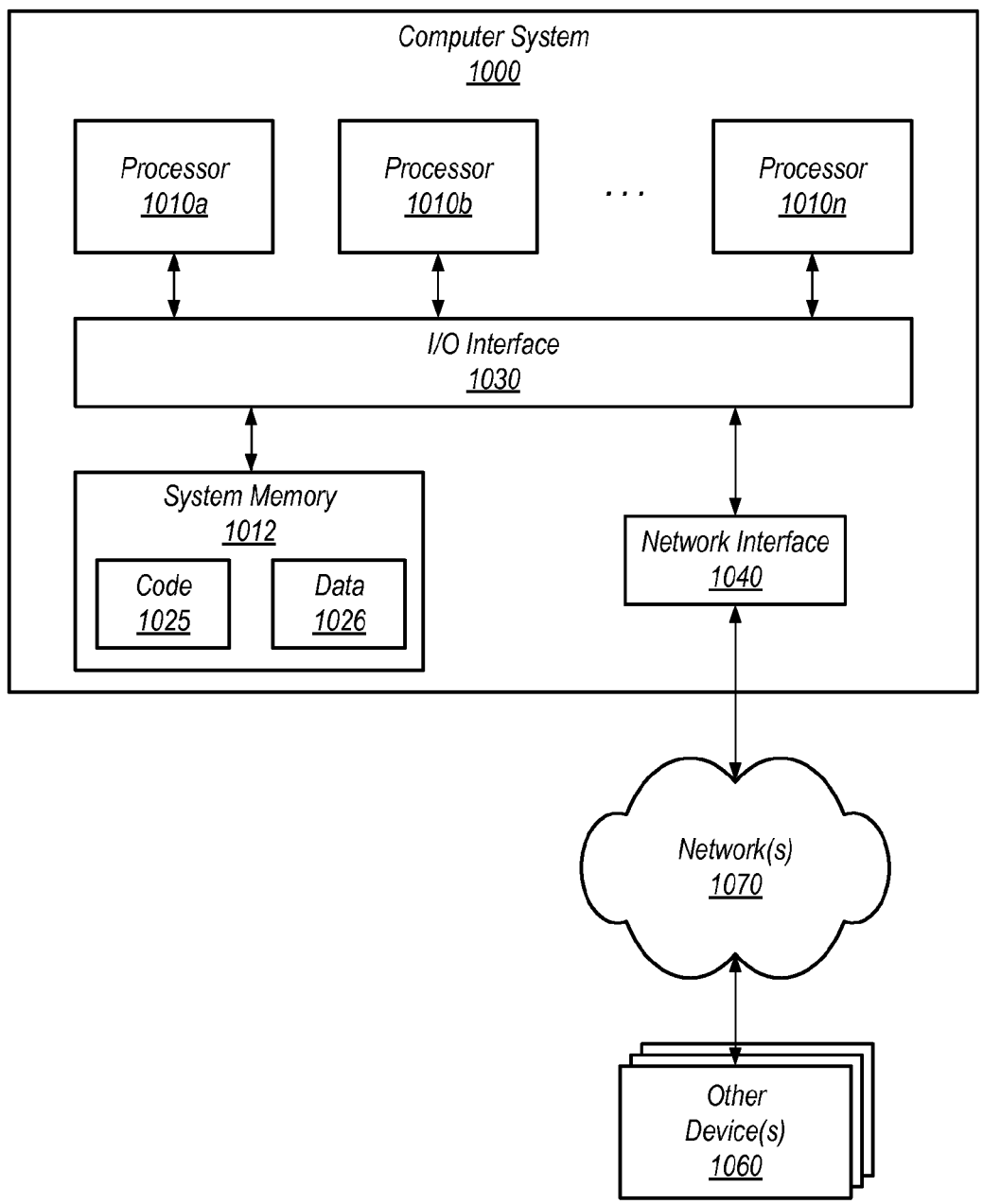
FIG. 10 is a block diagram illustrating an example computer system that may be used in some embodiments.

FIG. 10 is a block diagram illustrating an example computer system that may be used in some embodiments.

In some embodiments, a system that implements a portion or all of one or more of the technologies, including but not limited to a portion or all of providing independent control of separate cooling systems, air moving devices, cooling air vents of one or more cooling modules, independent control of one or more exhaust vents included in one or more inflatable structures, and various methods, systems, components, devices, and apparatuses as described herein, may include a general-purpose computer system that includes or is configured to access one or more computer-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of providing independent control of separate cooling systems, air moving devices, cooling air vents of one or more cooling modules, independent control of one or more exhaust vents included in one or more inflatable structures, and various methods, systems, components, devices, and apparatuses as described herein, are shown stored within system memory 1020 as code 1025 and data 1026.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices as illustrated in FIGS. 1 through 9, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a computer-accessible medium configured to store program instructions and data for implementing embodiments of methods as described above relative to FIGS. 1-9. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for deployment of a data center, the method comprising:
    positioning one or more pre-fabricated electrical modules at a particular data center site, wherein at least one of the electrical modules is configured to provide one or more of electrical power support or network communication support to at least one rack computer system;
    positioning one or more pre-fabricated cooling modules at the particular data center site, wherein at least one of the cooling modules is configured to provide cooling support to the at least one rack computer system, wherein, to provide cooling support to at least one rack computer system, the at least one of the cooling modules is configured to direct a stream of cooling air out of at least one cooling air vent;
    inflating an inflatable structure at the data center site, based at least in part on the stream of cooling air directed out of the at least one cooling air vent of the at least one of the cooling modules, such that the inflated inflatable structure at least partially establishes an inflatable enclosure of at least a portion of the data center site;
    installing one or more rack computer systems within the inflatable enclosure, wherein the rack computer systems are configured to provide computing capacity, and wherein the installing comprises electrically coupling the rack computer systems to the at least one electrical module; and
    operating at least one of the rack computer systems at the site to provide computing capacity.

2. The method of claim 1, wherein:
    positioning one or more pre-fabricated cooling modules at the particular data center site comprises positioning the one or more pre-fabricated cooling modules at a location adjacent to one end of a particular space in the particular data center site in a particular orientation, such that a particular side of the at least one cooling module which comprises the at least one cooling air vent faces towards the particular space; and
    positioning one or more pre-fabricated electrical modules at the particular data center site comprises positioning the one or more pre-fabricated electrical modules at a separate location adjacent to an opposite end of the particular space, where the opposite end is distal from the one end of the particular space, in a particular orientation, such that a particular side of the one or more pre-fabricated electrical modules faces towards the particular space and further faces towards the particular side of the one or more pre-fabricated cooling modules; and
    inflating the inflatable enclosure structure at the data center site comprises:
        coupling one end of the inflatable structure to the particular side of the one or more pre-fabricated cooling modules; and
        coupling another end of the inflatable structure to the particular side of the one or more pre-fabricated electrical modules, such that the inflatable structure extends across the particular space, between the one or more pre-fabricated cooling modules and the one or more pre-fabricated electrical modules.

3. The method of claim 1, comprising progressively expanding the computing capacity provided by the data center, wherein progressively expanding the computing capacity provided by the data center comprises:
    progressively extending the enclosure of the particular space to additionally enclose at least one additional space; and
    installing one or more additional rack computer systems within the enclosed at least one additional space.

4. The method of claim 3, wherein:
    the at least one cooling module comprises a plurality of air moving devices, wherein at least one air moving device is configured to direct cooling air into the particular space and at least one other air moving device is configured to direct cooling air into the at least one additional space;
    inflating the inflatable enclosure structure at the data center site comprises initially operating the at least one air moving device and inhibiting the at least one other air moving device, such that cooling air is directed into the particular space and is restricted from being directed into the at least one additional space; and
    progressively expanding the computing capacity provided by the data center comprises activating the at least one other air moving device, such that cooling air is directed by the at least one other air moving device into the at least one additional space.

5. A method, comprising:
    operating at least one cooling module, such that the at least one cooling module discharges a stream of cooling air into a particular space, wherein the at least one cooling module is configured to provide cooling support to at least one rack computer system based at least in part upon the discharged stream of cooling air; and
    inflating an inflatable structure, such that the inflated inflatable structure at least partially establishes an enclosure of the particular space, based at least in part upon the stream of cooling air discharged into the particular space by the at least one cooling module.

6. The method of claim 5, comprising:
positioning the at least one cooling module at a location associated with the particular space, such that the at least one cooling module is configured to direct the stream of cooling air out of at least one cooling air vent and into the particular space;
positioning at least one electrical module at a separate location associated with the particular space, wherein the at least one electrical module is configured to provide one or more of electrical power support or network communication support to at least one rack computer system; and
installing one or more rack computer systems within the enclosed space, wherein:
the rack computer systems are configured to provide computing capacity, and
the installing comprises electrically coupling the rack computer systems to the at least one electrical module.

7. The method of claim 6, wherein:
the inflatable structure comprises a flexible surface;
positioning the at least one cooling module at a location associated with the particular space comprises positioning the at least one cooling module adjacent to one end of the particular space in a particular orientation, such that a particular side of the at least one cooling module which comprises the at least one cooling air vent faces towards the particular space;
positioning at least one electrical module at a separate location associated with the particular space comprises positioning the at least one cooling module adjacent to an opposite end of the particular space, where the opposite end is distal from the one end of the particular space, in another particular orientation, such that a particular side of the at least one electrical module faces towards the particular space and further faces towards the particular side of the at least one cooling module; and
inflating the inflatable structure comprises:
coupling one end of the inflatable structure to the particular side of the at least one cooling module; and
coupling another end of the inflatable structure to the particular side of the at least one electrical module, such that the inflatable structure extends across the particular space, between the at least one cooling module and the at least one electrical module.

8. The method of claim 7, comprising:
progressively extending the enclosure of the particular space to additionally enclose at least one additional space; and
installing one or more additional rack computer systems within the enclosed at least one additional space.

9. The method of claim 8, wherein:
the at least one additional space extends between the particular side of the at least one cooling module and the particular side of the at least one electrical module and is adjacent to the particular space; and
progressively extending the enclosure of the particular space to additionally enclose at least one additional space comprises:
coupling one end of at least one additional inflatable structure to the particular side of the at least one cooling module;
coupling another end of the at least one additional inflatable structure to the particular side of the at least one electrical module, such that the at least one additional inflatable structure extends across the at least one additional space, between the at least one cooling module and the at least one electrical module; and
inflating the at least one additional inflatable structure, such that the inflated at least one inflatable structure at least partially establishes an enclosure of the at least one additional space, based at least in part upon the stream of cooling air discharged into the particular space by the at least one cooling module.

10. The method of claim 8, wherein:
the at least one additional space extends between the particular side of the at least one cooling module and the particular side of the at least one electrical module and is adjacent to the particular space; and
progressively extending the enclosure of the particular space to additionally enclose at least one additional space comprises:
extending the inflatable structure, between the at least one cooling module and the at least one electrical module, over the at least one additional space, such that the inflatable structure at least partially encloses both the particular space and the at least one additional space.

11. The method of claim 8, wherein:
the at least one cooling module comprises a plurality of cooling air vents, wherein at least one cooling air vent of the plurality of cooling air vents is configured to direct cooling air into the particular space and at least one other cooling air vent of the plurality of cooling air vents is configured to direct cooling air into the at least one additional space;
wherein each cooling air vent of the plurality of cooling air vents is independently controllable to discharge cooling air through each cooling air vent; and
the method further comprises:
prior to progressively extending the enclosure of the particular space to additionally enclose at least one additional space, controlling the plurality of cooling air vents to direct cooling air from the at least one cooling air vent and to restrict cooling air flow through the at least one other cooling air vent; and
after progressively extending the enclosure of the particular space to additionally enclose at least one additional space, controlling the at least one other cooling air vent to direct cooling air flow into the at least one additional space.

12. The method of claim 8, wherein:
the at least one cooling module comprises a plurality of air moving devices, wherein at least one air moving device of the plurality of air moving devices is configured to direct cooling air into the particular space and at least one other air moving device of the plurality of air moving devices is configured to direct cooling air into the at least one additional space;
wherein each air moving device of the plurality of air moving devices are independently controllable to independently control cooling air flow into separate spaces; and
the method further comprises:
prior to progressively extending the enclosure of the particular space to additionally enclose at least one additional space, controlling the plurality of air moving devices to direct cooling air into the particular space via the at least one air moving device and to restrict cooling air flow into the at least one additional space via the at least one other air moving device; and after progressively extending the enclosure of the particular space to additionally enclose at least one additional space, controlling the at least one other air moving device to direct cooling air flow into the at least one additional space.

13. The method of claim 5, wherein the inflatable structure comprises:

a flexible ceiling structure configured to encompass an upper end of the enclosed particular space; and at least one sidewall structure configured to at least partially encompass a side end of the enclosed particular space;

wherein the at least one sidewall structure is configured to be removably attached to the flexible ceiling structure.

14. The method of claim 5, wherein:

the at least one cooling module comprises a pre-fabricated cooling module.

15. A system, comprising:

at least one rack computer system, installed in a particular space, which is configured to provide computing capacity;

at least one cooling module comprising at least one cooling air vent and configured to provide cooling support to the at least one rack computer system via a stream of cooling air discharged via the at least one cooling air vent into the particular space; and at least one inflatable structure configured to at least partially establish an inflatable enclosure of the particular space based at least in part upon the stream of cooling air discharged by the at least one cooling air vent of the at least one cooling module into the particular space.

16. The system of claim 15, wherein:

the at least one cooling module is positioned at a location adjacent to one end of the particular space in a particular orientation, such that a particular side of the at least one cooling module which comprises the at least one cooling air vent faces into the particular space;

the at least one inflatable structure is coupled, at one end, to the at least one cooling module; and the at least one inflatable structure is coupled, at another end which is distal from the one end, to an anchoring structure, such that the at least one inflatable structure extends between the at least one cooling module and the anchoring structure over the particular space.

17. The system of claim 16, comprising:

at least one electrical module configured to provide one or more of electrical power support or network communication support to the at least one rack computer system installed in the particular space;

wherein the at least one electrical module comprises the anchoring structure, such that the at least one inflatable structure extends between the at least one cooling module and the at least one electrical module over the particular space.

18. The system of claim 16, wherein:

the at least one inflatable structure is configured to be extended over at least one additional space, such that the at least one inflatable structure encloses both the particular space and the at least one additional space.

19. The system of claim 15, wherein:

the at least one cooling module comprises a plurality of air moving devices, wherein at least one air moving device is configured to direct cooling air into the particular space and at least one other air moving device is configured to direct cooling air into the at least one additional space; and each air moving device of the plurality of air moving devices is independently controllable to independently control cooling air flow into separate spaces.

20. The system of claim 15, wherein:

the at least one cooling air vent is located on a particular end of the at least one cooling module;

the at least one cooling module comprises at least one additional cooling air vent located on a different end of the at least one cooling module, relative to the particular end;

the at least one cooling module is configured to provide an additional stream of cooling air which is discharged, via the at least one additional cooling air vent, into at least one additional space which is adjacent to the different end of the at least one cooling module; and the system comprises at least one additional inflatable structure configured to at least partially establish an inflatable enclosure of the additional space based at least in part upon the additional stream of cooling air discharged by the at least one additional cooling air vent of the at least one cooling module into the additional space.

* * * * *